US006875551B2

(12) United States Patent
Jimbo et al.

(10) Patent No.: US 6,875,551 B2
(45) Date of Patent: Apr. 5, 2005

(54) HEAT-SENSITIVE RECORDING MATERIAL

(75) Inventors: Yoshihiro Jimbo, Shizuoka-ken (JP); Hisato Nagase, Shizuoka-ken (JP); Yasuhiro Mitamura, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 47 days.

(21) Appl. No.: 10/643,906

(22) Filed: Aug. 20, 2003

(65) Prior Publication Data

US 2004/0161694 A1 Aug. 19, 2004

(30) Foreign Application Priority Data

Aug. 23, 2002 (JP) ....................................... 2002-243075

(51) Int. Cl.[7] ............................ G03F 7/021; G03F 7/26

(52) U.S. Cl. ....................... 430/138; 430/157; 430/163; 430/171; 430/187

(58) Field of Search ................................ 430/138, 157, 430/163, 171, 187

(56) References Cited

U.S. PATENT DOCUMENTS

| | | | | | |
|---|---|---|---|---|---|
| 4,650,740 | A | * | 3/1987 | Usami et al. | 430/176 |
| 5,925,489 | A | * | 7/1999 | Kawabuchi et al. | 430/138 |
| 5,935,757 | A | * | 8/1999 | Yamada et al. | 430/138 |
| 6,060,206 | A | * | 5/2000 | Hanaki et al. | 430/138 |
| 6,150,067 | A | * | 11/2000 | Koike et al. | 430/159 |
| 6,228,553 | B1 | * | 5/2001 | Matsushita et al. | 430/179 |
| 6,723,482 | B2 | * | 4/2004 | Ito | 430/138 |
| 2003/0052310 | A1 | * | 3/2003 | Michot et al. | 252/500 |

OTHER PUBLICATIONS

Zhu Shi–Zheng , et al., Synthesis and Decomposition of Benzenediazonium Tris (trifluoromethyl)sulfonyl)methanide, $C_6H_5N_2+(CF_3SO_2)_3C–$, and Benzenediazonium Bis ((trifluoromethyl)sulfonyl)amide, Inorganic Chemistry, vol. 32, No. 2, 1993, pp. 223–226.

Haas, Alois, et al., Preparation and Pyrolysis of Phenyldiazonium Bis (trifluoromethylsulfonyl)amide, Mendeleev Commun., 1992.

Barbero, Margherita, et al., New Dry Arenediazonium Salts, Stabilized To An Exceptionally High Degree By The Anion Of 0–Benzenedisulfonimide, Synthesis, Aug. 1998, pp. 1171–1175.

Barbero, Margherita, et al., A Simple Preparation of Aryl Methanesulfonates by Thermal Decomposition of Dry Arenediazonium o–Benzenedisulfonimides in Methanesulfonic Acid, Paper, 1998, pp. 90–93.

* cited by examiner

*Primary Examiner*—John S. Chu
(74) *Attorney, Agent, or Firm*—Sughrue Mion, PLLC

(57) ABSTRACT

A heat-sensitive recording material including a substrate and a heat-sensitive recording layer containing a diazonium salt and a coupler, the heat-sensitive recording layer being disposed on or over the substrate, wherein the diazonium salt is a compound represented by the following general formula (1):

General formula (1)

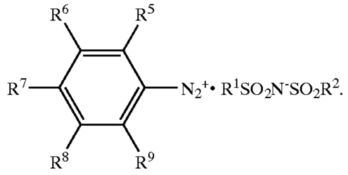

18 Claims, No Drawings

HEAT-SENSITIVE RECORDING MATERIAL

CROSS-REFERENCE TO RELATED APPLICATION

This application claims priority under 35USC 119 from Japanese Patent Application No. 2002-243075, the disclosure of which is incorporated by reference herein.

BACKGROUND OF THE INVENTION

1. Field of the Invention

The present invention relates to a heat-sensitive recording material, and in particular to a heat-sensitive recording material in which a diazonium salt and a coupler are used as color-developing components.

2. Description of the Related Art

A diazonium salt is a compound that has very high chemical activity, reacts with a phenol derivative or a compound (what is called, a coupler) having an active methylene group, so as to produce an azo dye easily, and further has photosensitivity. Consequently, the salt is decomposed by irradiation with light so that the activity is lost. Thus, diazo compounds have been used for a long time in optical recording materials, a typical example of which is a diazo copying material (see "Basis of Photographic Engineering—Non silver halide photography-", edited by Society of Photographic Science Technology of Japan and published by Corona Publishing Co., Ltd., (1982), pp.89–117, and pp. 182–201).

Furthermore, recently a diazonium salt has been applied to a recording material in which the fixation of images is required, using the nature that the salt is decomposed by light so that the activity thereof is lost. Typically, proposed is an optical fixation type heat-sensitive recording material, in which a diazonium salt and a coupler are heated and caused to react with each other in accordance with image signals so as to form images, and subsequently the images are fixed by irradiation with light (Koji Sato et al., "Journal of the Institute of Image Electrons Engineers of Japan" Vol. 11, No. 4 (1982) pp.290–296, etc.).

Such a recording material using a diazonium salt as a color-developing component has a drawback that the shelf life of the recording material is short since the chemical activity of the diazonium salt is very high and it thermally decomposes gradually even in a dark place so that the reactivity is lost. The recording material also has a drawback that the diazonium salt compound which remains in the background portion, which is a non-image portion, decomposes at the time of optical fixation so that the generation of the decomposition product (stain), which is colored, causes the non-image portion to be colored. Additionally, the recording material has a drawback that the light resistance of the non-image portion is weak in the recorded material which is completed after the fixation and thus if the recorded material is allowed to stand under sunlight or a fluorescent lamp for a long time, the coloration increases.

As methods for improving such instability of a diazonium salt, various methods have been proposed so far. As one of the most effective methods, there is known a method of encapsulating a diazonium salt into microcapsules. By encapsulating a diazonium salt into microcapsules, the diazonium salt is isolated from decomposing-promoting materials such as water and bases. Consequently, the decomposition thereof is remarkably suppressed. The shelf life of the recording material obtained using this method is also drastically improved (Tomomasa Usami et al., "Journal of the Society of Electrophotography of Japan" Vol. 26, No. 2 (1987), pp. 115–125).

As described above, an ordinary method for encapsulating a diazonium salt into microcapsules is a method of dissolving the diazonium salt into a hydrophobic solvent (an oil phase), adding this to an aqueous solution wherein a water-soluble polymer is dissolved (a water phase), emulsifying and dispersing the resultant mixture in a homogenizer or the like, and further adding a monomer or a prepolymer which will be a wall material of the microcapsules to either of the oil phase or the water phase, or both of the phases. In this way, a polymerization reaction is generated or a polymer is precipitated on the interface between the oil phase and the water phase, so as to form walls of the polymer compound, thereby forming the microcapsules. Such a method is described in details in "Microcapsule" (written by Asashi Kondo, and published by the Nikkan Kogyo Shimbun, Ltd. in 1970), "Microcapsule" (written by Tamotsu Kondo et al., and published by Sankyo Shuppan Co., Ltd. in 1977), and other documents.

Examples of the material used in the capsule walls of the formed microcapsules include crosslinked gelatin, alginic acid salts, celluloses, urea resin, urethane resin, melamine resin, and nylon resin.

In particular, in the case of microcapsules having walls made of a material having a glass transition temperature which is slightly higher than room temperature, such as urea resin or urethane resin, the capsule walls exhibits substance-nonpermeability at room temperature but exhibits substance-permeability at a temperature of glass transition or higher. These microcapsules are called heat responsible microcapsules, and are very useful for heat-sensitive recording materials.

In other words, in a heat-sensitive recording material wherein a heat-sensitive recording layer which comprises, as color-developing main components, heat responsible microcapsules containing a diazonium salt and a coupler outside the microcapsules is disposed on a substrate, the diazonium salt can be stably held for a long time and further color developed images can easily be formed by heating. Additionally, the formed images can be fixed by irradiation with light.

Accordingly, by the encapsulation of a diazonium salt into microcapsules, the stability of the recording material can be drastically improved. However, the instability resulting from the diazonium salt itself cannot be completely suppressed, and a sufficient long-term storability of heat-sensitive recording materials has not yet been obtained.

In recent years, it has been highly desired to reduce the time required for recording an image, that is, accelerate image-formation, which includes the steps of printing an image and fixing the image. In particular, in an optical fixation type heat-sensitive recording material using a diazonium salt, it has been highly desired to develop a technique for improving the above-mentioned stability and acceleration as well. In order to meet the desire, it is an essential requirement to improve the photolysis speed of a diazonium salt itself.

In order to perform optical fixation effectively in such a recording material using a diazonium salt as a color-developing component, it has been general to irradiate an ultraviolet ray having a wavelength of about 360 nm in the fixation step. However, such an ultraviolet ray has problems that an especial light source is required and an effect thereof on eyes is feared. Thus, there has been demanded a recording material using a diazonium salt capable of being effectively fixed by a visible light source having a wavelength longer than 400 nm.

However, with respect to a recording material using a conventional diazonium salt, when inactivated by a light source having a wavelength longer than 400 nm, the recording material has such problems that it is slow and takes a long time for fixation.

Diazonium salts having various counter anions have been known so far. In general, the following are known as inorganic anions: a hexafluorophosphoric acid ion, a fluoroboric acid ion, a chloride ion, a hydrogensulfate ion, and a sulfuric acid ion; and the following are known as organic ions: a polyfluoroalkylcarboxylic acid ion, polyfluoroalkylsulfonic acid ion, an aromatic carboxylic acid ion, an aromatic sulfonic acid ion, a tetraarylborate ion, and so on. In particular, a hexafluorophosphoric acid ion and a fluoroboric acid ion are generally known. However, these have problems of low solubility in organic solvents, low stability, and the like, and, thus, they are not easily used as ingredients of recording materials with advantages. A diazonium salt having a sulfoneimide anion as a counter anion is mentioned in "Journal of Fluorine Chemistry, 2000, 106, 139", "Inorganic Chemistry, 1993, 32, 223", "Mendeleev. Commun., 1992, 70", "Synthesis, 1998, 1171", "Synthesis, 1999, 90", and so on. However, these salts have a low solubility in organic solvents and a high water-solubility. Thus, it is difficult to use these salts as ingredients for recording materials with advantages.

Hitherto, diazonium salt compounds with variously altered structures have been proposed in order to solve these problems. However, a diazonium salt having the following three properties has not been discovered: a high storage stability; a high solubility in hydrophobic organic solvents; and a sufficient fixing rate when fixed using a fixing light source having a wavelength longer than 400 nm.

SUMMARY OF THE INVENTION

An object of the present invention is to provide a heat-sensitive recording material using a diazonium salt and a coupler as color-developing components, which is superior in storage stability and has a satisfactory fixing rate in fixation using a fixing light source having a wavelength longer than 400 nm.

Aspects of the invention for attaining the above-mentioned object are as follows.

A first aspect of the invention provides a heat-sensitive recording material comprising a substrate and a heat-sensitive recording layer containing a diazonium salt and a coupler, the heat-sensitive recording layer is disposed on or over the substrate, wherein the diazonium salt is a compound represented by the following general formula (1):

General formula (1)

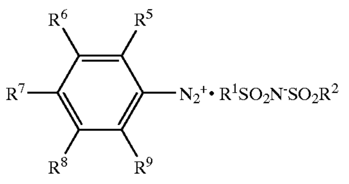

In general formula (1), $R^1$ and $R^2$ each independently represent an alkyl group or an aryl group; $R^5$, $R^6$, $R^7$, $R^8$ and $R^9$ each independently represent one selected from the group consisting of a hydrogen atom, a chlorine atom, a bromine atom, an alkyl group, an aryl group, an alkoxy group, an aryloxy group, an acyl group, an alkoxycarbonyl group, an aryloxycarbonyl group, a carbamoyl group, a cyano group, an alkylthio group, an arylthio group, an alkylsulfonyl group, an arylsulfonyl group, an amino group, an amido group, and a nitro group; and two ore more of $R^1$, $R^2$, $R^5$, $R^6$, $R^7$, $R^8$ and $R^9$ may be bonded to each other to form a ring.

A second aspect of the invention provides the heat-sensitive recording material of the first aspect, wherein the diazonium salt is a compound represented by the following general formula (2):

General formula (2)

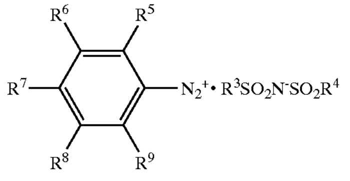

In general formula (2), $R^3$ and $R^4$ each independently represent a fluoroalkyl group or a fluoroaryl group; $R^5$, $R^6$, $R^7$, $R^7$ and $R^9$ represent the same groups as in the general formula (1); and two or more of $R^3$, $R^4$, $R^5$, $R^6$, $R^7$, $R^8$ and $R^9$ may be bonded to each other to form a ring.

A third aspect of the invention provides the heat-sensitive recording material of the first or second aspect, wherein the diazonium salt is a compound represented by the following general formula (3):

General formula (3)

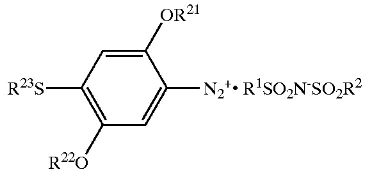

In general formula (3), $R^1$ and $R^2$ each independently represent an alkyl group or an aryl group; $R^{21}$, $R^{22}$ and $R^{23}$ each independently represent an alkyl group or an aryl group; and $R^1$ and $R^2$ may be bonded to each other to form a ring.

A fourth aspect of the invention provides the heat-sensitive recording material of any one of the first to third aspects, wherein the diazonium salt is a compound represented by the following general formula (4):

General formula (4)

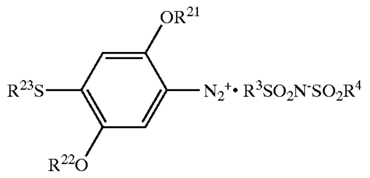

In general formula (4), $R^3$ and $R^4$ each independently represent a fluoroalkyl group or a fluoroaryl group; $R^{21}$, $R^{22}$ and $R^{23}$ each independently represent an alkyl group or an aryl group; and $R^3$ and $R^4$ may be bonded to each other to form a ring.

A fifth aspect of the invention provides the heat-sensitive recording material of any one of the first to fourth aspects, wherein the coupler is a compound represented by the following general formula (5):

$E^1—CH_2—E^2$ General formula (5)

In general formula (5), $E^1$ and $E^2$ each independently represent an electron attractive group, and $E^1$ and $E^2$ may be bonded to each other to form a ring.

A sixth aspect of the invention provides the heat-sensitive recording material of any one of the first to fifth aspects, wherein any one of the diazonium salts represented by the general formulae (1) to (4) is encapsulated in microcapsules.

A seventh aspect of the invention provides the heat-sensitive recording material of the sixth aspect, wherein capsule walls of the microcapsules in which any one of the diazonium salts represented by the general formulae (1) to (4) is encapsulated contain at least one of polyurethane and polyurea.

DETAILED DESCRIPTION OF THE INVENTION

The heat-sensitive recording material of the present invention is a heat-sensitive recording material comprising a heat-sensitive recording layer containing a coupler and a diazonium salt, wherein the diazonium salt is a compound represented by the general formula (1), which will be detailed below. Preferably, the heat-sensitive recording material comprises a surfactant, an organic base, a color-development auxiliary, an antioxidant, a free radical generating agent, or other components.

The heat-sensitive recording material of the invention will be described in details hereinafter.

<<Heat-Sensitive Recording Material>>

<Diazonium Salt>

The heat-sensitive recording material of the invention comprises a diazonium salt represented by the following general formula (1):

General formula (1)

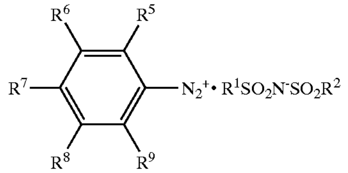

In the general formula (1), $R^1$ and $R^2$ each independently represent an alkyl or aryl group. The alkyl group represented by $R^1$ or $R^2$ may have a substituent, and is preferably an alkyl group having 1 to 20 carbon atoms in total. Specific examples thereof include methyl, ethyl, normal butyl, cyclohexyl, trifluoromethyl, perfluoroethyl, perfluoropropyl, perfluorobutyl, perfluorooctyl groups, and the like. Among them, particularly preferred are fluoroalkyl groups such as trifluoromethyl, perfluoroethyl, perfluoropropyl, perfluorobutyl, and perfluorooctyl groups.

In the general formula (1), the aryl group represented by $R^1$ or $R^2$ may have a substituent, and is preferably an aryl group having 6 to 20 carbon atoms in total. Specific examples thereof include phenyl, 4-methylphenyl, 4-methoxyphenyl, 4-methoxycarbonylphenyl, 2-methoxycarbonylphenyl, 4-chlorophenyl, 4-fluorophenyl, and pentafluorophenyl groups. Among them, particularly preferred are fluoroaryl groups such as 4-fluorophenyl and pentafluorophenyl groups.

In the general formula (1), $R^5$, $R^6$, $R^7$, $R^8$ and $R^9$ each independently represent a hydrogen, chlorine or bromine atom, or an alkyl, aryl, alkoxy, aryloxy, acyl, alkoxycarbonyl, aryloxycarbonyl, carbamoyl, cyano, alkylthio, arylthio, alkylsulfonyl, arylsulfonyl, amino, amido or nitro group.

$R^1$, $R^2$, $R^5$, $R^6$, $R^7$, $R^8$ and $R^9$ may be bonded to each other to form a ring.

In the general formula (1), the alkyl group represented by $R^5$, $R^6$, $R^7$, $R^8$ and $R^9$ may have a substituent or no substituent. An alkyl group having 1 to 30 carbon atoms in total is preferred. Preferred examples thereof include methyl, ethyl, normal propyl, isopropyl, normal butyl, tertiary butyl, normal hexyl, normal octyl, 2-ethylhexyl, 3,5,5-trimethylhexyl, normal dodecyl, cyclohexyl, benzyl, α-methylbenzyl, allyl, 2-chloroethyl, 2-methoxyethyl, 2-ethoxyethyl, 2-phenoxyethyl, 2-(2,5-di-tertiary-amylphenoxy)ethyl, 2-benzoyloxyethyl, methoxycarbonylmethyl, methoxycarbonylethyl, butoxycarbonylethyl, 2-isopropyloxyethyl, 2-methanesulfonylethyl, 2-ethoxycarbonylmethyl, 1-(4-methoxyphenoxy)-2-propyl, trichloromethyl and trifluoromethyl groups.

In the general formula (1), the aryl group represented by $R^5$, $R^6$, $R^7$, $R^8$ and $R^9$ may have a substituent or no substituent. An aryl group having 6 to 30 carbon atoms in total is preferred. Preferred examples thereof include phenyl, 4-methylphenyl, 3-methylphenyl, 2-methylphenyl, 4-chlorophenyl, 2-chlorophenyl, 4-nitrophenyl, 4-acetoamidophenyl, 4-octanoylaminophenyl, and 4-(4-methylphenylsulfonylamino)phenyl groups.

In the general formula (1), the alkoxy group represented by $R^5$, $R^6$, $R^7$, $R^8$ and $R^9$ may have a substituent. An alkoxy group having 1 to 20 carbon atoms in total is preferred. Preferred examples thereof include methoxy, ethoxy, normal propyloxy, isopropyloxy, normal butyloxy, tertiary butyloxy, normal hexyloxy, normal octyloxy, 2-ethylhexyloxy, 3,5,5-trimethylhexyloxy, normal decyloxy, normal dodecyloxy, cyclohexyloxy, 3-pentyloxy, benzyloxy, allyloxy, 2-methoxyethoxy, 2-ethoxyethoxy, 2-phenoxyethoxy, neopentyloxy, 2-(2,5-di-tertiary-amylphenoxy)ethoxy, 2-benzoyloxyethoxy, methoxycarbonylmethyloxy, methoxycarbonylethyloxy, butoxycarbonylethyloxy and 2-isopropyloxyethyloxy.

Among them, particularly preferred are 3-pentyloxy, normal hexyloxy, normal octyloxy, 3,5,5-trimethylhexyloxy, 2-ethylhexyloxy and neopentyloxy groups.

In the general formula (1), the aryloxy group represented by $R^5$, $R^6$, $R^7$, $R^8$ and $R^9$ may have a substituent. An aryloxy group having 6 to 20 carbon atoms in total is preferred. Preferred examples thereof include phenoxy, 4-methylphenoxy, 2-methylphenoxy and 2-chlorophenoxy groups.

Among them, particularly preferred are phenoxy and 4-methylphenoxy groups.

In the general formula (1), the acyl group represented by $R^5$, $R^6$, $R^7$, $R^8$ and $R^9$ may have a substituent. An acyl group having 2 to 30 carbon atoms in total is preferred. Preferred examples thereof include acetyl, propionyl, butanoyl and benzoyl groups.

In the general formula (1), the alkoxycarbonyl group represented by $R^5$, $R^6$, $R^7$, $R^8$ and $R^9$ may have a substituent. An alkoxycarbonyl group having 2 to 30 carbon atoms in total is preferred. Preferred examples thereof include methoxycarbonyl, ethoxycarbonyl and butoxycarbonyl groups.

In the general formula (1), the aryloxycarbonyl group represented by $R^5$, $R^6$, $R^7$, $R^8$ and $R^9$ may have a substituent. An aryloxycarbonyl group having 7 to 30 carbon atoms in total is preferred. A preferred example thereof is a phenoxycarbonyl group.

In the general formula (1), the carbamoyl group represented by $R^5$, $R^6$, $R^7$, $R^8$ and $R^9$ may have a substituent. A carbamoyl group having 1 to 30 carbon atoms in total is preferred. Preferred examples thereof include carbamoyl, N,N-dimethylcarbamoyl, N,N-diethylcarbamoyl, N,N-dioctylcarbamoyl, morpholinocarbonyl, pyrrolidinocarbonyl, piperidinocarbonyl, and hexamethyleneiminocarbonyl groups.

In the general formula (1), the alkylthio group represented by $R^5$, $R^6$, $R^7$, $R^8$ and $R^9$ may have a substituent. An alkylthio group having 1 to 20 carbon atoms in total is preferred. Preferred examples thereof include methylthio, ethylthio, normal butylthio, tertiary butylthio, normal hexylthio, normal octylthio, 2-ethylhexylthio, normal dodecylthio, cyclohexylthio, benzylthio and ethoxycarbonylmethylthio groups.

Among them, particularly preferred are normal butylthio, normal octylthio and benzylthio groups.

In the general formula (1), the arylthio group represented by $R^5$, $R^6$, $R^7$, $R^8$ and $R^9$ may have a substituent or no substituent. An arylthio group having 6 to 30 carbon atoms in total is preferred. Preferred examples thereof include phenylthio, 4-methyphenylthio, 3-methylphenylthio, 2-methylphenylthio, 4-chlorophenylthio and 2-chlorophenylthio groups.

Among them, particularly preferred are phenylthio, 4-methylphenylthio and 4-chlorophenylthio groups.

In the general formula (1), the alkylsulfonyl group represented by $R^5$, $R^6$, $R^7$, $R^8$ and $R^9$ may have a substituent. An alkylsulfonyl group having 1 to 20 carbon atoms in total is preferred. Preferred examples thereof include methyl sulfonyl, ethylsulfonyl, normal butylsulfonyl, normal hexylsulfonyl, normal octylsulfonyl, 2-ethylhexylsulfonyl, normal decylsulfonyl, normal dodecylsulfonyl, cyclohexylsulfonyl, benzylsulfonyl and ethoxycarbonylmethylsulfonyl groups.

Among them, particularly preferred are normal decylsulfonyl, normal dodecylsulfonyl and benzylsulfonyl groups.

In the general formula (1), the arylsulfonyl group represented by $R^5$, $R^6$, $R^7$, $R^8$ and $R^9$ may have a substituent or no substituent. An arylsulfonyl group having 6 to 30 carbon atoms in total is preferred. Preferred examples thereof include phenylsulfonyl, 4-methylphenylsulfonyl, 3-methylphenylsulfonyl, 2-methylphenylsulfonyl, 4-chlorophenylsulfonyl and 2-chlorophenylsulfonyl groups.

Among them, particularly preferred are phenylsulfonyl and 4-methylphenylsulfonyl groups.

In the general formula (1), the amide group represented by $R^5$, $R^6$, $R^7$, $R^8$ and $R^9$ may have a substituent or no substituent. Preferred examples thereof include dimethylamino, diethylamino, dipropylamino, dibutylamino, N-methyl-N-octylamino, N-methyl-N-dodecylamino, N-methyl-N-2-octanoyloxyethylamino, morphlino, pyrrolidino, piperidino, hexamethyleneimino, 4-(2-ethylhexyl)piperidino, 4-benzenesulfonylpiperidino, indolino, bis(N,N-dibutylcarbamoylmethyl)amino and N-methyl-N-benzylamino groups.

Among them, particularly preferred are dimethylamino, N-methyl-N-dodecylamino, pyrrolidino, morphlino, piperidino, and hexamethyleneimino groups.

In the general formula (1), the amide group represented by $R^5$, $R^6$, $R^7$, $R^8$ and $R^9$ may have a substituent or no substituent. Preferred examples thereof include acetoamide, propionylamino, pivaloylamino, N-methylacetoamide, benzamide, 2-methoxybenzamide, 4-methoxybenzamide, and 2-oxopyrrolidino groups.

Among them, particularly preferred are acetoamide, 2-methoxybenzamide, and 2-oxopyrrolidino groups.

When $R^1$ and $R^2$ are bonded to each other in the general formula (1), the ring formed by the bonding is preferably a 5-membered or 6-membered heteroring. Particularly preferred are an o-benzenedisulfonic acid imide anion, a 3,4,5,6-tetrachloro-o-benzenedisulfonic acid imide anion, a 2,6-dithiapiperidine-2,2,6,6-tetraoxide anion, and a 3,3,4,4,5,5-hexafluoro-2,6-dithiapiperidine-2,2,6,6-tetraoxide anion.

When any two groups selected from $R^3$ to $R^7$ are bonded to each other, the formed ring is preferably a 5-membered or 6-membered unsaturated ring or heteroring. Particularly preferred are benzene, cyclohexene and oxazine rings.

The diazonium salt, which is represented by the general formula (1), in the present invention may have a structure represented by the following general formula (2):

General formula (2)

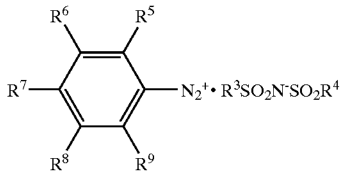

In general formula (2), $R^3$ and $R^4$ each independently represent a fluoroalkyl group or a fluoroaryl group; $R^5$, $R^6$, $R^7$, $R^8$ and $R^9$ represent the same groups as in the general formula (1); and two or more of $R^3$, $R^4$, $R^5$, $R^6$, $R^7$, $R^8$ and $R^9$ may be bonded to each other to form a ring.

Further, it is preferred that the diazonium salt represented by the general formula (1) in the invention has a structure represented by the following general formula (3):

General formula (3)

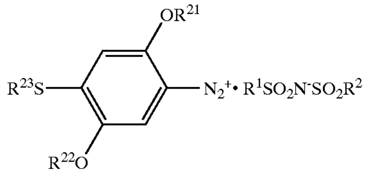

In the general formula (3), $R^1$ and $R^2$ have the same meanings as in the general formula (1).

In the general formula (3), the alkyl group represented by $R^{21}$ or $R^{22}$ may have a substituent, and is preferably an alkyl group having 1 to 30 carbon atoms in total. Preferred examples thereof include methyl, ethyl, normal propyl, isopropyl, normal butyl, tertiary butyl, secondary butyl, isobutyl, normal pentyl, 2-pentyl, 3-pentyl, isopentyl, normal hexyl, normal octyl, 2-ehtylhexyl, 3,5,5-trimethylhexyl, normal dodecyl, cyclohexyl, benzyl, allyl, 2-chloroethyl, 2-methoxyethyl, 2-ethoxyethyl, 2-isopropyloxyethyl, 2-allyloxyethyl, 2-butoxyethyl, 2-phenoxyethyl, 2-(2,5-di-tertiary-amylphenoxy)ethyl, 2-benzoyloxyethyl, methoxycarbonylmethyl, methoxycarbonylethyl, and butoxycarbonylethyl groups.

Among them, particularly preferred are ethyl, normal butyl, normal hexyl, 2-ethylhexyl, 3,5,5-trimethylhexyl, and 2-isopropyloxyethyl groups.

In the general formula (3), the aryl group represented by $R^{21}$ or $R^{22}$ may have a substituent, and is preferably an aryl group having 6 to 30 carbon atoms in total. Preferred examples thereof include phenyl, 4-methylphenyl, 3-methylphenyl, 2-methylphenyl, 4-chlorophenyl and 2-chlorophenyl groups.

Among them, particularly preferred are phenyl and 4-methylphenyl groups.

In the general formula (3), the alkyl group represented by $R^{23}$ may have a substituent, and is preferably an alkyl group having 1 to 30 carbon atoms in total. Preferred examples thereof include methyl, ethyl, normal propyl, isopropyl, normal butyl, isobutyl, normal pentyl, 2-pentyl, 3-pentyl, isopentyl, normal hexyl, normal octyl, 2-ethylhexyl, 3,5,5-trimethylhexyl, normal dodecyl, cyclohexyl, benzyl, allyl, 2-methoxyethyl, 2-ethoxyethyl, 2-phenoxyethyl, 2-(2,5-di-tertiary-amylphenoxy)ethyl, methoxycarbonylmethyl, methoxycarbonylethyl, and butoxycarbonylethyl groups.

Among them, particularly preferred are normal butyl, normal octyl, 2-ethylhexyl, cyclohexyl and benzyl groups.

In the general formula (3), the aryl group represented by $R^{23}$ may have a substituent, and is preferably an aryl group having 6 to 30 carbon atoms in total. Preferred examples thereof include phenyl, 4-methylphenyl, 3-methylphenyl, 2-methylphenyl, 4-chlorophenyl and 2-chlorophenyl groups.

Among them, particularly preferred are phenyl, 4-methylphenyl and 4-chlorophenyl groups.

The diazonium salt, which is represented by the general formula (1), in the present invention may have a structure represented by the following general formula (4):

General formula (4)

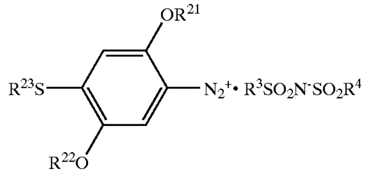

In general formula (4), $R^3$ and $R^4$ each independently represent a fluoroalkyl group or a fluoroaryl group; $R^{21}$, $R^{22}$ and $R^{23}$ each independently represent an alkyl group or an aryl group; and $R^3$ and $R^4$ may be bonded to each other to form a ring.

<Method for Producing a Diazonium Salt>

A diazonium salt represented by any one of the general formulae (1) to (4) of the invention can be produced by a known method. More specifically, sodium nitrite, nitrosylsulfuric acid, isoamyl nitrite or the like is used to convert the corresponding aniline derivative into a diazo compound in an acidic solvent, and then a compound represented by the following general formula (A) or (B) is added to the present system so as to perform salt-exchange. In this way, the diazonium salt can be yielded.

$R^1SO_2N^-SO_2R^2.M^+$ General formula (A)

$R^3SO_2N^-SO_2R^4.M^+$ General formula (B)

wherein $R^1$ and $R^2$ have the same meanings as in the general formula (1), and $R^3$ and $R^4$ have the same meanings as in the general formula (2); and $M^+$ represents a cation. The cation is preferably an inorganic cation. Among them, particularly preferred are a sodium ion and a potassium ion.

A diazonium salt represented by any one of the general formulae (1) to (4) of the invention may be in either oily state or crystal state. From a viewpoint of handling property, a diazonium salt in a crystal state is preferred. Diazonium salts represented by the general formulae (1) to (4) may be used alone or in combination of two or more thereof. In the case that a compound represented by any one of the general formulae (1) to (4) is used in a heat-sensitive recording material, it is preferred to use the compound in an amount of 0.02 to 5 $g/m^2$ in its heat-sensitive recording layer. From a viewpoint of developed color density thereof, it is preferred to use the compound in an amount of 0.1 to 4 $g/m^2$.

In order to give stability to the diazonium salt, zinc chloride, cadmium chloride, tin chloride or the like may be used to form a complex compound and stabilize diazonium compounds. These diazonium salt and complex compound thereof may be used alone or in combination of two or more thereof.

Specific examples of the diazonium salt of the invention are given hereinafter. However, the diazonium salt of the invention is not limited to these examples.

D-1

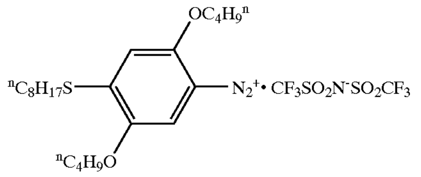

D-2

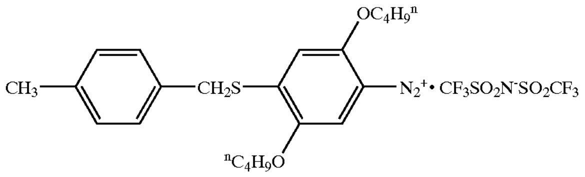

D-3

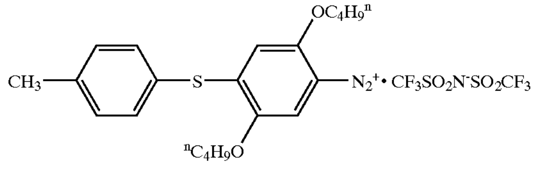

D-4

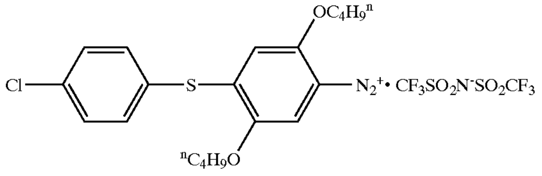

D-5

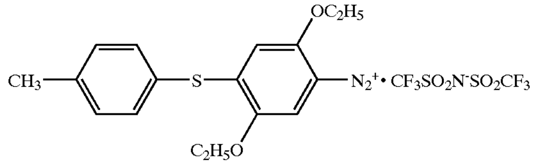

D-6

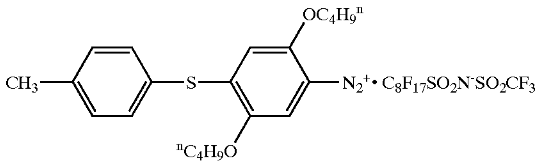

-continued
D-7
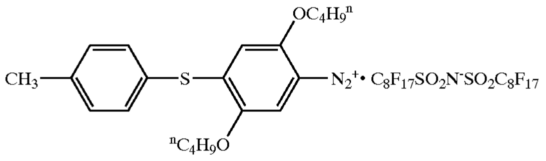
D-8
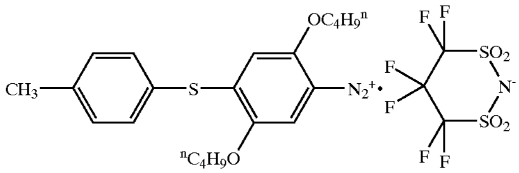
D-9
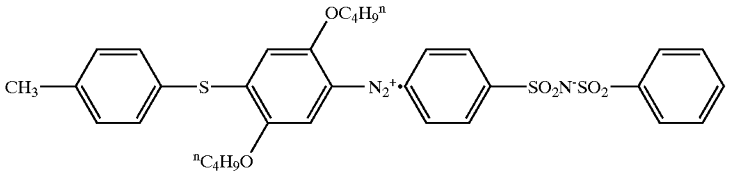
D-10
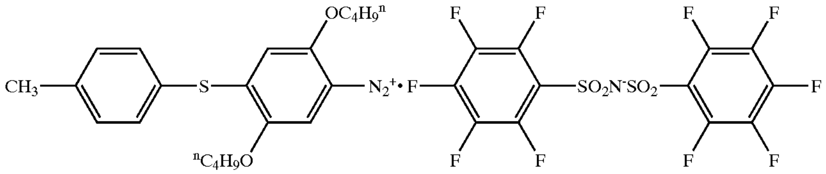
D-11
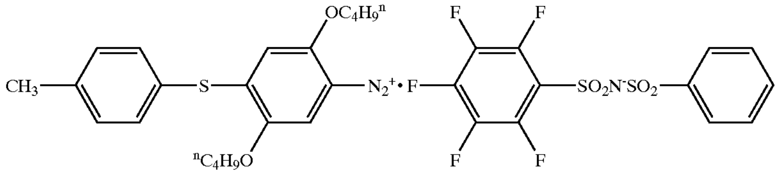
D-12
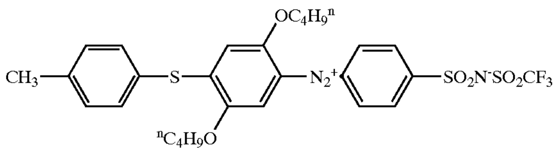
D-13
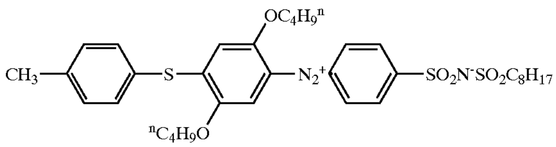
D-14
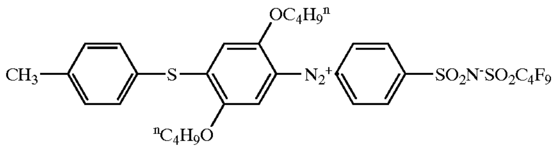
D-15
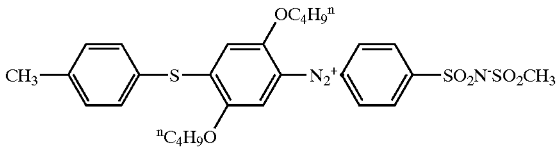
D-16
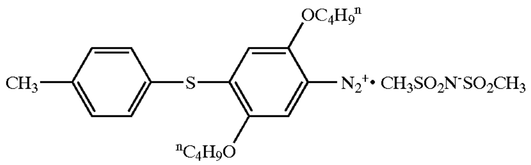
D-17
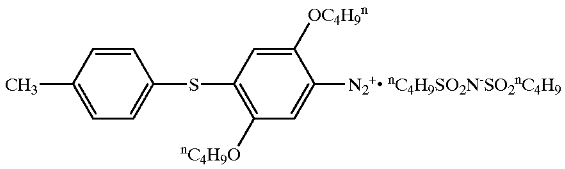
D-18
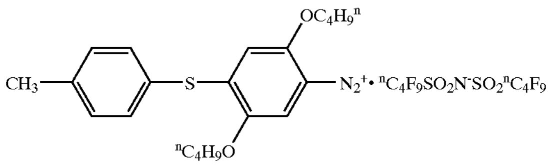
D-19
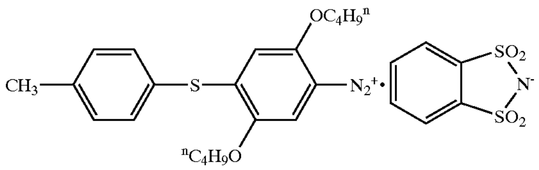

-continued

D-20

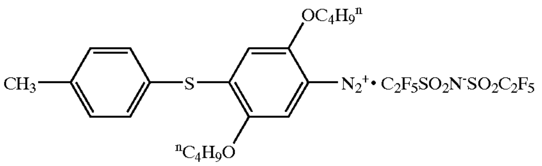

D-21

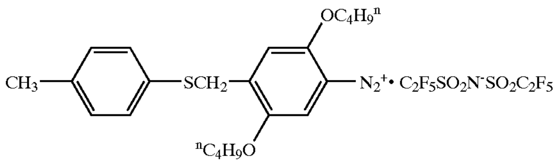

<Coupler>

The following will describe a coupler (coupling component) which can be used in the heat-sensitive recording material of the invention.

The coupler may be any compound that is coupled with the diazonium salt to form a dye in a basic atmosphere and/or a neutral atmosphere. Any one of what are called the 4-equivalent couplers for haloganated silver halide photographic photosensitive materials can be used as the coupler. A desired coupler can be selected from these couplers depending on the targeted hue.

The coupler may be, for example, what is called an active methylene compound, which has a methylene group adjacent to a carbonyl group, a phenol derivative, or a naphthol derivative. Specific examples thereof are given below, and a compound selected from such examples may be used as far as the compound satisfies the object of the invention.

Specific examples of the coupler include resorcin, phloroglucin, 2,3-dihydroxynaphthalene, 2,3-dihydronaphthalene-6-sulfonate, 1-hydroxy-2-naphtoic acid morpholinopropylamide, sodium 2-hydroxy-3-naphthalenesulfonate, 2-hydroxy-3-naphthalenesulfonic acid anilide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethylhexylamide, 5-acetoamide-1-naphthol, sodium 1-hydroxy-8-acetoamidenaphthalene-3,6-disulfonate, 1-hydroxy-8-acetoamidenaphthalene-3,6-disulfonic acid dianilide, 1,5-dihydroxynaphthalene, 2-hydroxy-3-naphthoic acid morpholinopropylamide, 2-hydroxy-3-naphthoic aid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxydiphenyl)barbituric acid, N,N'-bis (octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetoamide)toluene, 1,3-bis-(pivaloylacetoamidemethyl)benzene, benzoylacetonitrile, thenoylacetonitrile, acetoacetoanilide, benzoylacetoanilide, pivaloylacetoanilide, 2-chloro-5-(N-n-butylsulfamoyl)-1-pivaloylacetoamidebenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one, 1-(4-n-octyloxyphenyl)-3-tert-butyl-5-aminopyrazole, and the like.

Details of the couplers are described in Japanese Patent Application Laid-Open (JP-A) Nos. 4-201483, 7-223367, 7-223368 and 7-323660; Japanese Patent Application Nos. 5-278608, 5-297024, 6-18669, 6-18670, 7-316280, 8-027095, 8-027096, 8-030799, 8-12610, 8-132394, 8-358755, 8-358756, and 9-069990; and other documents.

In the invention, the compound represented by the following general formula (5) or a tautomer thereof is particularly preferred among the above-mentioned exemplified compounds.

The following will describe the coupler represented by the general formula (5) in details.

$$E^1—CH_2—E^2 \quad \text{General formula (5)}$$

In the general formula (5), $E^1$ and $E^2$ each independently represent an electron attractive group. $E^1$ and $E^2$ may be bonded to each other to form a ring.

The electron attractive groups represented by $E^1$ and $E^2$ mean substituents each having a positive Hammett's $\sigma p$ value, and may be the same or different. Preferred examples thereof include acyl groups such as acetyl, propionyl, pivaloyl, chloroacetyl, trichloroacetyl, trifluoroacetyl, 1-methylcyclopropylcarbonyl, 1-ethylcyclopropylcarbonyl, 1-benzylcyclopropylcarbonyl, benzoyl, 4-methoxybenzoyl, and thenoyl groups; oxycarbonyl groups such as methoxycarbonyl, ethoxy carbonyl, 2-methoxyethoxycarbonyl, and 4-methoxyphenoxycarbonyl groups; carbamoyl groups such as carbamoyl, N,N-dimethylcarbamoyl, N,N-diethylcarbamoyl, N-phenylcarbamoyl, N-[2,4-bis(pentyloxy)phenyl] carbamoyl, N-[2,4-bis(octyloxy)phenyl]carbamoyl, and morpholinocarbonyl groups; alkylsulfonyl or arylsulfonyl groups such as methanesulfonyl, benzenesulfonyl, and toluenesulfonyl groups; phosphono groups such as a diethylphosphono group; heterocyclic groups such as benzoxazole-2-yl, benzothiazole-2-yl, 3,4-dihydroquinazoline-4-one-2-yl, and 3,4-dihydroquinazoline-4-sulfone-2-yl groups; heterocylic groups; a nitro group; an imino group; and a cyano groups.

The electron attractive groups represented by $E^1$ and $E^2$ may be bonded to each other to form a ring. The ring formed from $E^1$ and $E^2$ is preferably a 5-membered or 6-membered carbon ring or heteroring.

Exemplified compounds (B-1) to (B-38) are given hereinafter as specific examples of the coupler represented by the general formula (5). Tautomers of the couplers given below are also preferred.

B-1

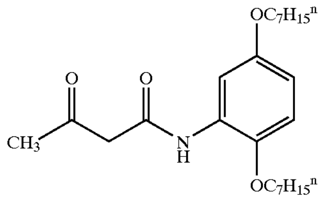

-continued
B-2
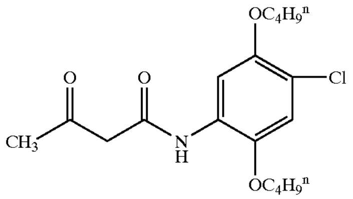
B-3
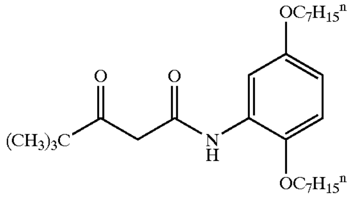
B-4
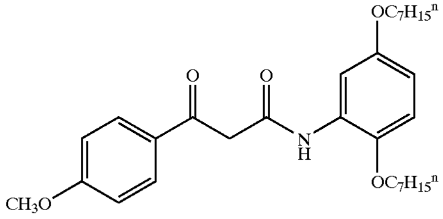
B-5
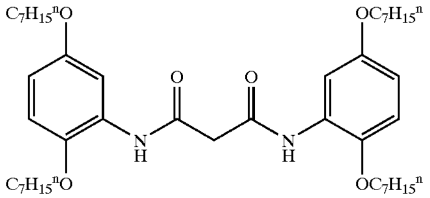
B-6
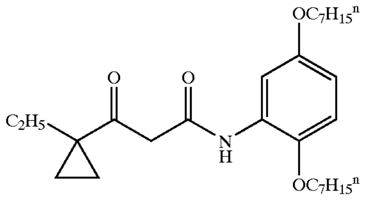
B-7
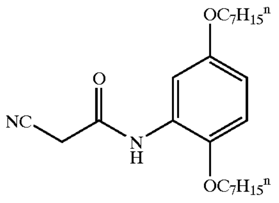
B-8
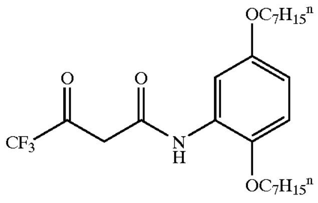
-continued
B-9
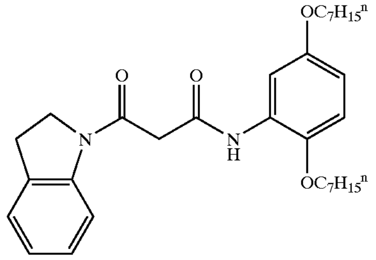
B-10
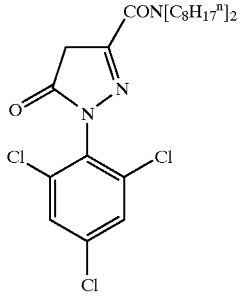
B-11
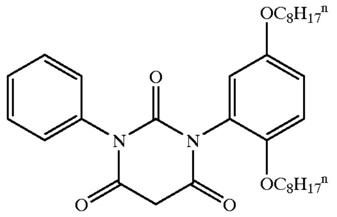
B-12
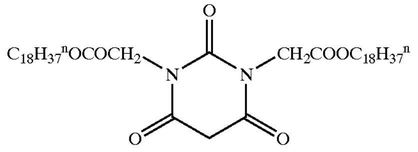
B-13
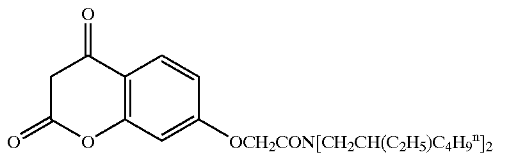
B-14
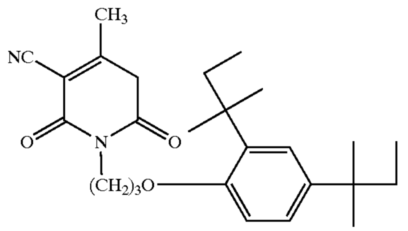
B-15
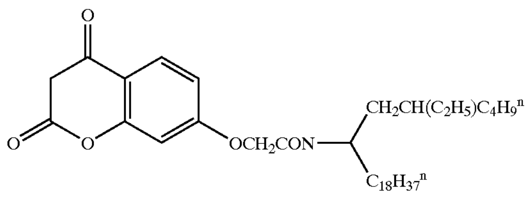

-continued
B-16
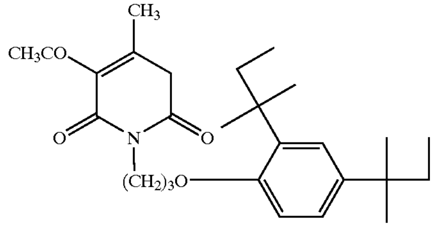
B-17
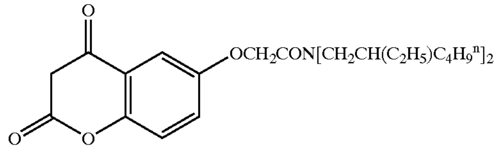
B-18
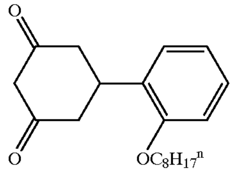
B-19
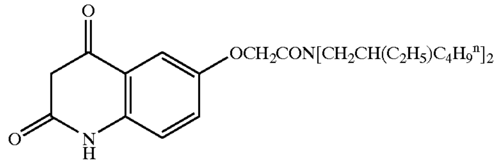
B-20
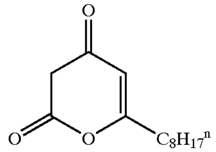
B-21
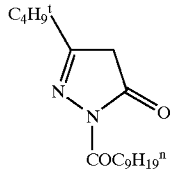
B-22
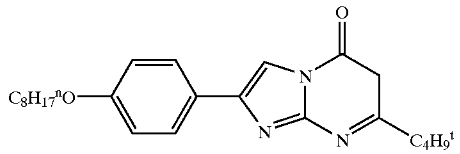
B-23
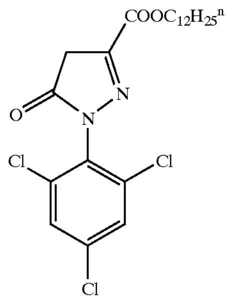
-continued
B-24
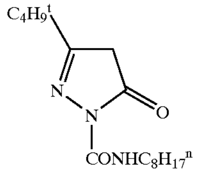
B-25
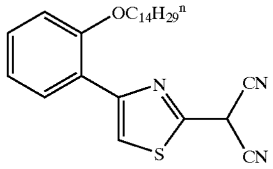
B-26
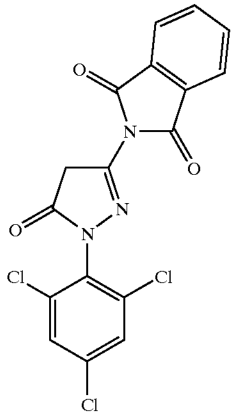
B-27
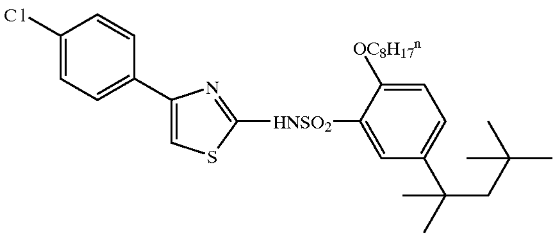
B-28
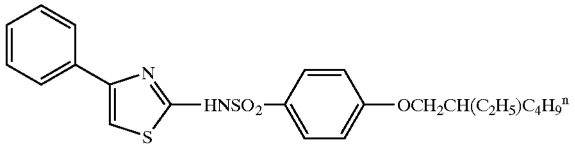
B-29
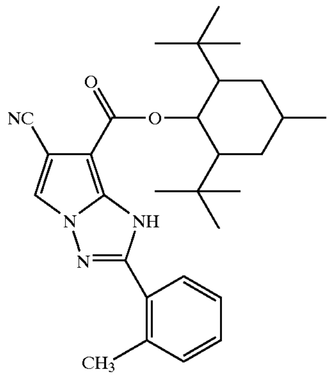

-continued
B-30
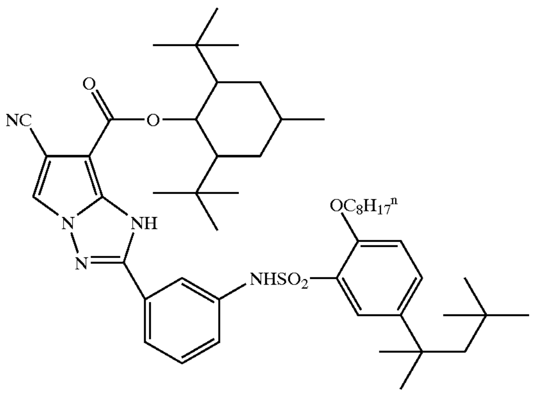
B-31
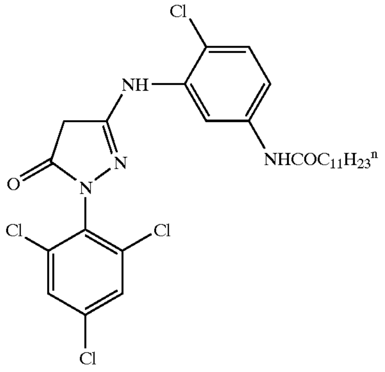
B-32
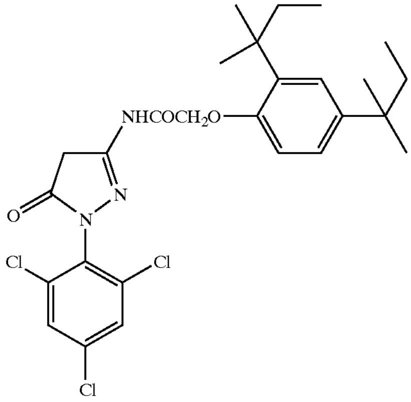
B-33
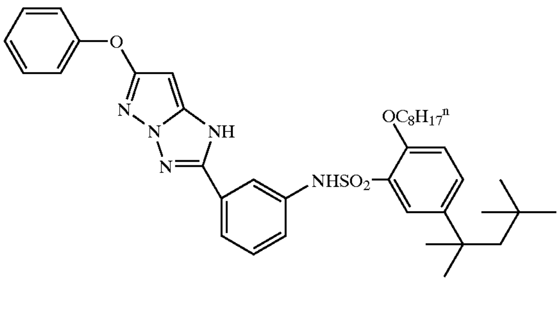
-continued
B-34
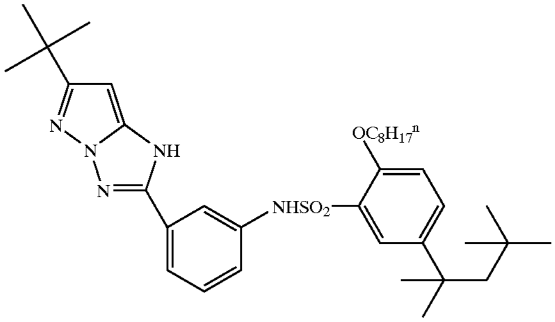
B-35
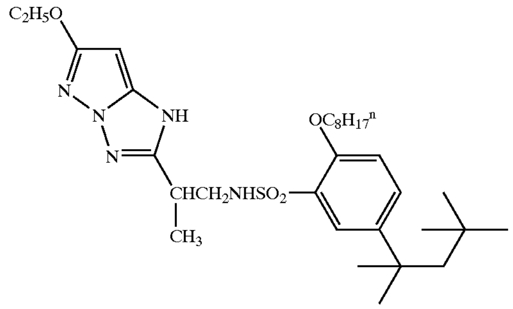
B-36
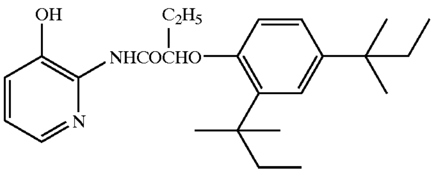
B-37
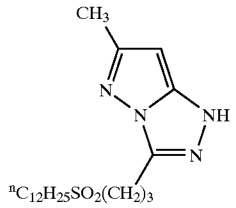
B-38
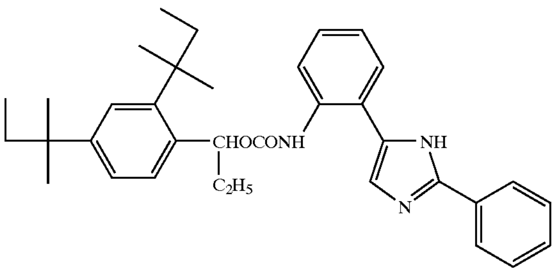
A tautomer of a coupler can be defined as an isomer of a coupler that is represented by the above compounds, and the structure can easily be changed between the coupler and the tautomer. As a coupler used in the invention, the tautomer of the coupler is also preferred.

<Surfactant>

The coupler used in the invention can be used in the state where the coupler is solid-dispersed together with a basic material, a color-development auxiliary, a water-soluble polymer, and others by a sand mill or the like. Preferably, the coupler is dissolved in an organic solvent slightly-soluble or insoluble in water, and subsequently this solution is mixed with a water phase containing a surfactant and/or a water soluble polymer as a protective colloid to prepare an emulsion-dispersed product. In order to make the emulsion-dispersion easier, it is preferred to use the surfactant.

The organic solvent used in this case can be appropriately selected from, for example, high boiling point oils described in JP-A No. 2-141279. Esters, among these oils, are preferred from a viewpoint of emulsification stability of the emulsion-dispersed product. Among them, tricresyl phosphate is particularly preferred. The above-mentioned oils may be used in combination, or any one of the oils may be used together with some other oil.

Further, an auxiliary solvent may be added, as a dissolution auxiliary having a low boiling point, to the above-mentioned organic solvent. Particularly preferred examples thereof include ethyl acetate, isopropyl acetate, butyl acetate and methylene chloride. As the case may be, no high boiling point oil is used and only the low boiling point auxiliary solvent may be used.

The water soluble polymer which is incorporated, as a protective colloid, into the water phase mixed with the oil phase containing the above-mentioned components can be appropriately selected from known anionic polymers, nonionic polymers and amphoteric polymers. Preferred examples of the water soluble polymer include polyvinyl alcohol, gelatin, and cellulose derivatives.

As the surfactant incorporated into the water phase, a surfactant which does not cause precipitation or condensation resulting from effect on the above-mentioned protective colloid can be appropriately selected from anionic and nonionic surfactants. Preferred examples of the surfactant include sodium alkylbenzenesulfonate, sodium alkylsulfate, sodium octyl sulfosuccinate, polyalkylene glycols (such as polyoxyethylenenonyl phenyl ether), and the like.

<Organic Base>

Organic bases may be added to the invention in order to promote the coupling reaction of the diazonium compound with the coupler. The organic bases may be used alone or in combination of two or more thereof. Examples of the organic bases include nitrogen-containing compounds such as tertiary amines, piperidines, piperadines, amidines, formamidines, pyridines, guanidines, and morpholines. Such compounds described in the following can be used: for example, Japanese Patent Application Publication (JP-B) Nos. 52-46806, 2-24916 and 2-28479; and JP-A Nos. 62-70082, 57-169745, 60-94381, 57-123086, 58-1347901, 60-49991, 60-165288 and 57-185430.

Among them, particularly preferred are piperadines such as N,N-bis(3-phenoxy-2-hydroxypropyl)piperadine, N,N'-bis[3-(p-methylphenoxy)-2-hydroxypropyl]piperadine, N,N'-bis[3-(p-methoxyphenoxy)-2-hydroxypropyl] piperadine, N,N'-bis(3-phenylthio-2-hydroxypropyl) piperadine, N,N'-bis[3-(β-naphthoxy)-2-hydroxypropyl] piperadine, N-3-(β-naphthoxy)-2-hydroxypropyl-N-methylpiperadine, and 1,4-bis{[3-(N-methylpiperadino)-2-hydroxy]propyloxy}benzene; morpholines such as N-[3-(β-naphthoxy)-2-hydroxy]propylmorpholine, 1,4-bis(3-morpholino-2-hydroxy-propyloxy)benzne, and 1,3-bis(3-morpholino-2-hydroxy-propyloxy)benzene; piperidines such as N-(3-phenoxy-2-hydroxypropyl)piperidine and N-dodecylpiperidine; and guanidines such as triphenylguanidine, tricyclohexylguanidine and dicyclohexylphenylguanidine.

In the invention, the use amount of each of the coupler and the organic base is preferably from 0.1 to 30 parts by mass per 1 part by mass of the diazo compound.

<Color-Development Auxiliary>

A color-development auxiliary besides the above-mentioned organic base may be added to the invention in order to promote color-development reaction. The color-development auxiliary is a substance for heightening the developed color density at the time of thermal recording or lowering the lowest developed color density. The substance causes the diazo compound, the basic material, the coupler or the like to fall into a situation which undergoes reaction easily by lowering the melting point of the coupler, the basic material, the diazo compound or the like or lowering the softening point of capsule walls.

For example, in order to perform thermal printing quickly and completely at a low energy, a color-development auxiliary as follows can be added to the recording layer: a phenol derivative, a naphthol derivative, an alkoxy-substituted benzene, an alkoxy-substituted naphthalene, an aromatic ether, a thioether, an ester, an amide, an ureido, an urethane, a sulfonamide compound, a hydroxyl compound or the like.

<Antioxidant>

In order to improve the fastness of a thermally-developed image against light and heat in the heat-sensitive recording material of the invention or decrease the yellowing of a non-printed portion by light after the image is fixed, it is preferred to use a known antioxidant and the like described below. Examples thereof are described in, for example, EP-A Nos. 223739, 309401, 309402, 310551, 310552 and 459416; German Patent Laid-Open No. 3435443; JP-A Nos. 54-48535, 62-262047, 63-113536, 63-163351, 2-262654, 2-71262, 3-121449, 5-61166 and 5-119449; U.S. Pat. Nos. 4,814,262 and 4,980,275.

Furthermore, it is effective in the invention to use known various additives that have already been used in heat-sensitive recording materials or pressure-sensitive materials. Examples of the additives include compounds described in JP-A Nos. 60-107384, 60-107383, 60-125470, 60-125471, 60-125472, 60-287485, 60-287486, 60-287487, 60-287488, 61-160287, 61-185483, 61-211079, 62-146678, 62-146680, 62-146679, 62-282885, 63-051174, 63-89877, 63-88380, 63-088381, 63-203372, 63-224989, 63-251282, 63-267594, 63-182484, 1-239282, 4-291685, 4-291684, 5-188687, 5-188686, 5-110490, 5-1108437 and 5-170361; JP-B Nos. 48-043294 and 48-033212; and the like.

Specific examples thereof include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanoate, 2,2,-bis(4-hydroxyphenyl)propane, 1,1-bis(4-hydroxyphenyl)-2-ethylhexane, 2-methyl-4-methoxy-diphenylamine, 1-methyl-2-phenylindole, and the like.

The addition amount of these antioxidants and the various additives is preferably in an amount of 0.05 to 100 parts (particularly preferably in an amount of 0.2 to 30 parts) by mass per 1 part by mass of the diazo compound. The known antioxidants and the various additives may be used in the form that they are incorporated, together with the diazo compound, into microcapsules; may be used together with the coupler, the basic material, and the color-development auxiliary in the form of a solid-dispersed product; may be used together with an appropriate emulsification auxiliary in the form of an emulsion; or may be used in the forms of the two. Of course, the antioxidants and the various additives may be used alone or in combination of two or more thereof. They may be added to a protective layer or caused to be present in the protective layer.

The antioxidants and the various additives may not be added to the same layer. The antioxidants and the various additive can be structurally classified into, for example, anilines, alkoxybenzenes, hindered phenols, hindered amines, hydroquinone derivatives, phosphorus compounds, sulfur compounds and so on; in the case that the antioxidants and the various additive are used in combination, the compounds having different structures may be combined or the compounds having equivalent structures may be combined.

<Free Radical Generating Agent, and So On>

A free radical generating agent which is used in a photopolymerizable composition or the like (a compound which generates a free radical by irradiation with light) may be added to the heat-sensitive recording material of the invention in order to reduce the yellowing of the background portion after recording. Examples of the radical generating agent include aromatic ketones, quinones, benzoins, benzoin ether, azo compounds, organic disulfides, acyloxime esters, and the like. The addition amount thereof is preferably from 0.01 to 5 parts by mass per 1 part by mass of the diazonium compound.

In order to decrease the yellowing in the same manner, a polymerizable compound having an ethylenic unsaturated bond (hereinafter, referred to as a vinyl monomer) can be used. The vinyl monomer is a compound having in the chemical structure thereof at least one ethylenic unsaturated bond (a vinyl group, a vinylidene group, and so on), and is in a chemical form such as a monomer or prepolymer form. Examples thereof include unsaturated carboxylic acids and salts thereof; esters made from an unsaturated carboxylic acid and a polyhydric aliphatic alcohol; and amides made from an unsaturated carboxylic acid and a polyhydric aliphatic amine compound. The vinyl monomer is used in an amount of 0.2 to 20 parts by mass per 1 part by mass of the diazonium compound. The free radical generating agent or the vinyl monomer may be encapsulated, together with the diazonium compound, into microcapsules.

An acid stabilizer such as citric acid, tartaric acid, oxalic acid, boric acid, phosphoric acid or pyrophosphoric acid, besides the above-mentioned materials, may be added to the invention.

<Microencapsulating Method>

As the method of forming microcapsules, any microcapsule-forming method known in the prior art can be used (see U.S. Pat. Nos. 3,726,804, 3,796,669, etc.). Specifically, an interfacial polymerization method or an internal polymerization method is suitable. More specifically, the diazonium salt is dissolved, together with a microcapsule wall precursor (wall material) and so on, into an organic solvent which is slightly soluble or insoluble in water, so as to prepare an oil phase, and then this phase is added to an aqueous solution of a water-soluble polymer (a water phase) and emulsified and dispersed in the water phase with a homogenizer or the like. The temperature of the present system is raised to form a polymer film (wall film), which will be microcapsule walls, on the interface between the oil and the water. In this way, microcapsules are obtained.

In the invention, the concentration of the diazonium salt is adjusted to 20 to 70% by mass of all nonvolatile oil-soluble components of the oil soluble components to be micro-encapsulated except the capsule wall component and the surfactant components out of the oil phase components, in particular, at the time of preparing the oil phase.

Examples of the polymer material (wall material) which will be the wall film include polyurethane resin, polyurea resin, polyamide resin, polyester resin, polycarbonate resin, aminoaldehyde resin, melamine resin, polystyrene resin, styrene-acrylate copolymer resin, styrene-methacrylate copolymer resin, gelatin, polyvinyl alcohol, and the like. Among them, particularly preferred are microcapsules each having a wall film comprising, as the constituent thereof, polyurethane resin and/or polyurea.

The following will describe an example of a process for producing diazonium salt encapsulated microcapsules (polyurea/polyurethane walls).

First, the diazonium salt is dissolved or dispersed in a hydrophobic organic solvent which will be cores of capsules (containing low boiling point solvent as required), so as to prepare an oil phase (organic solvent solution) which will be the cores of the microcapsules. At this time, to the oil phase may be further added a polyhydric isocyanate as a wall material, or a surfactant for attaining even and stable emulsification or dispersion. An additive such as a discoloration inhibitor or a stain inhibitor may be added thereto.

In the invention, the concentration of the diazonium salt is set to 20 to 70% by mass of all nonvolatile oil-soluble components of the oil soluble components except the capsule wall component (polyhydric isocyanate), the surfactant and the low boiling point solvent out of the oil phase components in the oil phase (organic solvent solution). In other words, the concentration is adjusted to 20 to 70% by mass of all nonvolatile oil-soluble components out of the diazonium salt, the high boiling point solvent (having a boiling point of 100° C. or more) and other oil-soluble additives, which are oil components constituting the oil phase in the present example.

The above-mentioned polyhydric isocyanate compound is preferably a compound having three or more functional isocyanate groups, and may be an isocyanate compound having two functional isocyanate groups. Specific examples thereof include dimers or trimers of a diisocyanate, such as xylenediisocyanate or a hydrogenated product thereof, hexamethylenediisocyanate, tolylenediisocyanate or a hydrogenated product thereof, or isophronediisocyanate, as a main material (biuret or isocyanurate); polyfunctional adducts of a polyol such as trimethylolpropane, and a bifunctional isocyanate such as xylylenediisocyanate; compounds wherein a macromolecular compound, such as a polyether having an active hydrogen such as polyethyleneoxide, is introduced into an adduct of a polyol such as trimethylolpropane, and a bifuntional isocyanate such as xylylenediisocyanate; and condensates of benzeneisocyanate with formalin.

Preferred are also compounds described in JP-A Nos. 62-212190, 4-26189, 5-317694, 8-268721, etc.

The use amount of the polyhydric isocyanate is decided in such a manner that the average particle size of the microcapsules will be from 0.3 to 12 $\mu$m and the wall thickness thereof will be from 0.01 to 0.3 $\mu$m, and the dispersed particle size thereof is approximately from 0.2 to 10 $\mu$m in general.

As the surfactant, a known surfactant for emulsification can be used. When the surfactant is added to the oil phase, the addition amount thereof is preferably from 0.1 to 5%, more preferably from 0.5 to 2% by mass of the oil phase.

The hydrophobic organic solvent for dissolving or dispersing the diazonium salt when the oil phase is prepared is preferably an organic solvent having a boiling point of 100 to 300° C., and examples thereof include alkylnaphthalene, alkyldiphenylethane, alkyldiphenylmethane, alkylbiphenyl, alkylterphenyl, chlorinated paraffin, phosphoric acid esters, maleic acid esters, adipic acid esters, phthalic acid esters, benzoic acid esters, carbonic acid esters, ethers, sulfuric acid esters, sulfonic acid esters, and the like. These may be mixed and used in combination of two or more kinds.

When the solubility of the diazonium salt in the organic solvent is poor, a low boiling point solvent having a high solubility of the diazonium salt may be used together as an auxiliary solvent. Examples thereof include ethyl acetate, propyl acetate, isopropyl acetate, butyl acetate, methylene chloride, tetrahydrofuran, acetonitrile, acetone, and the like.

That is, the diazonium salt preferably has an appropriate solubility in the hydrophobic organic solvent and the low boiling point solvent. Specifically, the solubility of the diazonium salt in the solvents is preferably 5% or more in order to adjust the concentration of the diazonium salt easily. The solubility thereof in water is preferably 1% or less.

Subsequently, the prepared oil phase is emulsified and dispersed in a water phase. At this time, an aqueous solution in which a water-soluble polymer is dissolved is used as the water phase. Thereto is added the oil phase, and then the oil phase is emulsified or dispersed by means of a homogenizer or the like. The water-soluble polymer acts as a dispersing medium for making the dispersion even and easy and stabilizing the emulsified and dispersed solution. In this case, the same surfactant as described above may be added to the present system in order to make the emulsification and dispersion of the solution more even and more stable.

The water-soluble polymer used in the water phase is preferably a water-soluble polymer having a solubility of 5% or more in water at a temperature at which the polymer is to be emulsified. Examples thereof include polyvinyl alcohol and modified products thereof, polyacrylic acid amide and derivatives thereof, ethylene-vinyl acetate copolymer, styrene-maleic anhydride copolymer, ethylene-maleic anhydride copolymer, isobutylene-maleic anhydride copolymer, polyvinyl pyrrolidone, ethylene-acrylic acid copolymer, vinyl acetate-acrylic acid copolymer, carboxymethylcellulose, methylcellulose, casein, gelatin, starch derivatives, gum arabic, sodium alginate, and the like.

The water-soluble polymer preferably has no reactivity or a low reactivity with any isocyanate compound. For example, about a polymer having in the molecular chain thereof reactive amino groups, such as gelatin, it is desired to modify the polymer beforehand to remove the reactivity.

In the emulsified and dispersed solution obtained by adding the oil phase to the water phase, polymerization reaction of the polyhydric isocyanate is generated on the interface between the oil phase and the water phase so as to form polyurea walls.

If a polyol and/or a polyamide is/are further add to the water phase or the hydrophobic solvent of the oil phase, the added component(s) react(s) with the polyhydric isocyanate to become one of the constituents of microcapsule walls. In order to accelerate the reaction rate of the above-mentioned reaction high, it is preferred to keep the reaction temperature high or add an appropriate polymerization catalyst to the reaction system.

Specific examples of the polyol or the polyamine include propylene glycol, glycerin, trimethylolpropane, triethanolamine, sorbitol, hexamethylenediamine, and the like. When the polyol is added to the reaction system, polyurethane walls are formed.

The above-mentioned polyhydric isocyanate, polyol, reaction catalyst, polyamine for making a part of the wall material, and so on are described in handbooks, "Polyurethane Handbook" (edited by Keiji Iwata, and published by the Nikkan Kogyo Shimbun, Ltd. (1987)).

The above-mentioned emulsification can be performed by means of an appropriate machine selected from known emulsifying machines such as a homogenizer, a Manton Gaulin, an ultrasonic disperser, a dissolver, and a Kedy mill.

After the emulsification, the emulsion is heated up to 30 to 70° C. in order to promote the reaction for forming the capsule walls. In order to prevent aggregation of the capsules in the reaction, it is necessary to add water to the reaction system to lower the probability of the collision between the capsules, perform sufficient stirring, and the like. A dispersant for preventing the aggregation may be added to the reaction system.

As the polymerization reaction advances, the generation of carbon dioxide is observed. The time at which the generation stops can be regarded as the end point of the capsule wall forming reaction. Usually, by allowing the reaction to continue for several hours, target microcapsules in which the diazonium salt is encapsulated can be yielded.

<<Method for Producing a Heat-sensitive Recording Material>>

In the heat-sensitive recording material of the invention, it is preferred to prepare a coating solution which contains microcapsules that contain the diazonium compound, a coupler, an organic base and other additives, apply the coating solution onto a substrate, such as paper or a synthetic resin film, by such a coating method as bar coating, blade coating, air-knife coating, gravure coating, roll coating, spray coating, dip coating, curtain coating, and the like, and then dry the applied solution so as to form a heat-sensitive layer having a solid content of 2.5 to 30 g/$m^2$. In the heat-sensitive recording material of the invention, the microcapsules, the coupling component, the base and so on may be contained in the same layer, or may be contained in different layers in a lamination type recording material. It is allowable to form an intermediate layer as described in Japanese Patent Application No. 59-177669 or the like on a substrate and then apply the heat-sensitive layer thereon.

The binder used in the heat-sensitive recording material of the invention may be a known water-soluble macromolecular compound or latex. Examples of the water-soluble macromolecular compound include methylcellulose, carboxymethylcellulose, hydroxyethylcellulose, hydroxypropylcellulose, starch derivatives, casein, gum arabic, gelatin, ethylene/maleic anhydride copolymer, styrene/maleic anhydride copolymer, polyvinyl alcohol, epichlorohydrin/modified polyamide, isobutylene/maleic anhydride salicylic acid copolymer, polyacrylic acid, polyacrylic acid amide, and the like, and modified products thereof. Examples of the latex include styrene/butadiene rubber latex, methyl acrylate/butadiene rubber latex, vinyl acetate emulsion, and the like.

The pigment which can be used in the heat-sensitive recording material of the invention may be any known pigment, which may be inorganic or organic. Specific examples thereof include kaolin, fired kaolin, talc, agalmatolite, diatomite, calcium carbonate, aluminum hydroxide, magnesium hydroxide, zinc oxide, lithopone, amorphous silica, colloidal silica, fired gypsum, silica, magnesium carbonate, titanium oxide, alumina, barium carbonate, barium sulfate, mica, micro balloon, urea-formalin fillers, polyester particles, cellulose fillers, and the like.

If necessary, in the heat-sensitive recording material of the invention, there may be used various known additives such as a wax, an antistatic agent, an antifoaming agent, a conductive agent, a fluorescent dye, a surfactant, an ultraviolet absorber, and precursors thereof.

<Protective Layer>

As required, a protective layer may be disposed on the surface of the recording layer in the heat-sensitive recording material of the invention. Two or more protective layers may be disposed on the surface as required. Examples of the material used in the protective layer include water-soluble polymer compounds such as polyvinyl alcohol, carboxy-modified polyvinyl alcohol, vinyl acetate/acrylamide copolymer, silicon-modified polyvinyl alcohol, starch, modified starch, methylcellulose, carboxymethylcellulose, hydroxymethylcellulose, gelatins, gum arabic, casein, styrene-maleic acid copolymer hydrolyzates, styrene/maleic acid copolymer half-ester hydrolyzates, isobutene/maleic anhydride copolymer hydrolyzates, polyacrylamide derivatives, polyvinyl pyrrolidone, sodium polystyrenesulfonate, sodium alginate, and the like; and latexes such as styrene/butadiene rubber latex, acrylonitrile/butadiene rubber latex, methyl acrylate/butadiene rubber latex, and vinyl acetate emulsion. The water-soluble polymer compound of the protective layer may be crosslinked to improve the storage stability still more. A crosslinking agent used in the crosslinking may be a known crosslinking agent. Specific examples thereof include water-soluble initial condensates such as N-methylolurea, N-methylolmelamine, and urea-formalin; dialdehyde compounds such as glyoxal and glutaraldehyde; inorganic crosslinking agents such as boric acid and borax; polyamide epichlorohydrin; and and the like. In the protective layer, a known pigment, metal soap, wax, surfactant or the like may be further used. The coating amount of the protective layer is preferably from 0.2 to 5 $g/m^2$, and more preferably from 0.5 to 2 $g/m^2$. The film thickness thereof is preferably from 0.2 to 5 $\mu$m, and more preferably from 0.5 to 2 $\mu$m.

When the protective layer is used in the heat-sensitive recording material of the invention, a known ultraviolet absorber or a precursor thereof may be incorporated into the protective layer.

<Substrate>

As the substrate of the invention, any one of paper supports used in ordinary pressure sensitive paper, heat-sensitive paper, and dry or wet diazo copying paper, and so on may be used. Alternatively, acidic paper, neutral paper, coated paper, plastic film laminated paper, synthetic paper, plastic paper or the like may be used. In order to correct the curl balance of the substrate or improve the resistance thereof against chemicals from a rear face, a back coat layer may be disposed on the substrate, or a peelable sheet may be adhered onto the rear face via an adhesive layer so as to form a label. This back coat layer may be formed in the same way as the protective layer.

When the recording face of the heat-sensitive recording material of the invention is heated with a thermal head or the like, the capsule walls made of polyurea and/or polyurethane are softened, so that the coupler and the basic compound outside the capsules enter the insides of the capsules. In this way, a color is developed. After the color development, light having an absorption wavelength of the diazonium compound is irradiated onto the recording layer, whereby the diazo compound decomposes so that the reactivity thereof is lost. As a result, the image is fixed.

As the fixing light source, there may be used any one of various fluorescent lamps, a xenon lamp, a mercury lamp and so on. It is preferred that the emission spectrum thereof is substantially equal to the absorption spectrum of the diazonium compound since the fixing can be effectively attained. In the invention, a fixing light source having an emission center wavelength longer than 400 nm is particularly preferred.

In the invention, a multicolor recording material can be produced by using photolytic diazo compounds having different photolysis wavelengths in different layers.

When the heat-sensitive recording material of the invention is made up to the multi-layered multicolor recording material, an intermediate layer may be formed in order to prevent color mixing between heat-sensitive recording layers. This intermediate layer is made of a water-soluble polymer such as gelatin, phthalated gelatin, polyvinyl alcohol or polyvinyl pyrrolidone, and may appropriately contain various additives.

EXAMPLES

The present invention will be specifically described by way of the following examples. However, the scope of the invention is not limited to these examples.

Example 1

(1) Preparation of a Gelatin Solution

<Preparation of a Phthalated Gelatin Solution>

32 parts of phthalated gelatin (trade name: MGP gelatin, manufactured by Nippi Collagen Co., Ltd.) and 0.9143 part of 1,2-benzothiazoline-3-one (a 3.5% solution thereof in methanol, manufactured by Daito Chemix Corp.) were mixed with 367.1 parts of ion exchange water, and then were dissolved at 40° C. to yield an aqueous phthalated gelatin solution.

<Preparation of an Alkali-Treated Gelatin Solution>

25.5 parts of an alkali-treated low-ion gelatin (trade name; #750 gelatin, manufactured by Nitta Gelatin Inc.), 0.7286 part of 1,2-benzothiazoline-3-one (a 3.5% solution thereof in methanol, manufactured by Daito Chemix Corp.), and 0.153 part of calcium hydroxide were mixed with 143.6 parts of ion exchange water, and then dissolved at 50° C. to yield an aqueous gelatin solution for preparing emulsion.

(2) Preparation of a Yellow Heat-Sensitive Recording Layer Solution

<Preparation of a Diazonium Salt Compound Encapsulated Microcapsule Solution (a)>

To 17.2 parts of ethyl acetate were added 4.9 parts of a diazonium salt compound (exemplified compound D-3), 4.6 parts of monoisopropylbiphenyl, 4.4 parts of diphenyl phthalate, and 0.4 part of diphenyl-(2,4,6-trimethylbenzoyl) phosphineoxide (trade name: Lucirin TPO, manufactured by BASF Japan Ltd.), and the resultant mixture was heated to 40° C. to dissolve the respective components evenly. To the mixed solution were added 8.8 parts of a mixture of a xylylenedisocyanate/trimethylolpropane adduct and a xylylenedisocyanate/bisphenol A adduct (trade name: Takenate D119N (a 50% by mass solution thereof in ethyl acetate), manufactured by Mitsui Takeda Chemical Co., Ltd.) as a capsule wall material, and then the resultant was evenly stirred so as to yield a mixed solution (I).

Separately, 16.3 parts of ion exchange water and 0.34 part of Scraph AG-8 (50% by mass) manufactured by Nippon Fine Chemical Co., Ltd.) were added to 60.6 parts of the aqueous phthalated gelatin solution, to yield a mixed solution (II).

The mixed solution (I) was added to the mixed solution (II), and a homogenizer (manufactured by Nippon Seiki Seisakusyo Co., Ltd.) was used to emulsify and disperse the solution at 40° C. To the resultant emulsion were added 20 parts of water, and the mixture was homogenized. The resultant was then stirred at 40° C. to conduct encapsulating reaction for 3 hours while removing ethyl acetate. Thereafter, thereto were added 4.0 parts of an ion exchange resin (Amberlite IRA68, manufactured by Organo Corp.) and 8.0 parts of an ion exchange resin (Amberlite IRC50, manufactured by Organo Corp.), and further the mixture was stirred for 1 hour. Thereafter, the ion exchange resins were filtrated to be removed. The solid concentration in the capsule solution was adjusted so as to be 20.0%. In this way, a diazonium salt compound encapsulated microcapsule solution (a) was yielded. The particle size of the resultant microcapsules was measured with a particle size meter (LA-700, manufactured by Horiba Ltd.). As a result, the median size thereof was 0.355 $\mu$m.

<Preparation of a Coupler Compound Emulsion (a)>

Into 33.0 parts of ethyl acetate were dissolved 10.2 parts of a coupler compound N-(2',5'-di-normal-heptyloxy) phenylacetoanilide (exemplified compound B-1), 9.9 parts of triphenylguanidine (manufactured by Hodogaya Chemical Co., Ltd.), 20.0 parts of 4,4'-(m-phenylenediisopropylidene)diphenol (trade name: Bisphenol M, manufactured by Mitsui Chemicals, Inc.), 3.3 parts of 3,3,3',3'-tetramethyl-5,5'6,6'-tetra(1-propyloxy)-1-1'-spirobisindane, 14.6 parts of 4-(2-ethylhexyloxy) benzenesulfonamide (manufactured by Manac Inc.), 6.8 parts of 4-n-pentyloxybenzenesulfonamide (manufactured by Manac Inc.), and 4.2 parts of calcium dodecylbenzenesulfonate (trade name: Pionin A-41-C, a 70% solution thereof in methanol, manufactured by Takemoto Oil & Fat Co., Ltd.), so as to yield a mixed solution (III).

Separately, 107.3 parts of ion exchange water were mixed with 208.3 parts of the aqueous alkali-treated gelatin solution to yield a mixed solution (IV).

The mixed solution (III) was added to the mixed solution (IV), and the resultant was subjected to emulsification and dispersion with a homogenizer (manufactured by Nippon Seiki Seisakusyo Co., Ltd.) at 40° C. The resultant coupler compound emulsion was heated under reduced pressure to remove ethyl acetate. Thereafter, the solid concentration therein was adjusted to be 22% by mass. The particle size of the resultant coupler compound emulsion was measured with a particle size meter (LA-700, manufactured by Horiba Ltd.). As a result, the median size thereof was 0.22 $\mu$m.

Furthermore, to 100 parts of the coupler compound emulsion were added 9 parts of a solution wherein the concentration of an SBR latex (trade name: SN-307, a 48% solution thereof, manufactured by Sumika ABS Latex Co., Ltd.) was adjusted to 22%, and then the resultant was homogeneously stirred to yield a coupler compound emulsion (a).

<Preparation of a Coating-Solution (a)>

The diazonium salt compound encapsulated microcapsule solution (a) and the coupler compound emulsion (a) were mixed in such a manner that the mole ratio between the encapsulated coupler compound and diazo compound would be 2/1, to yield the coating-solution (a) for a heat-sensitive recording layer.

(3) Preparation of a Coating Solution for an Intermediate Layer

The following were mixed: 98.0 parts of alkali-treated low-ion gelatin (trade name: #750 gelatin, manufactured by Nitta Gelatin Inc.), 2.857 parts of 1,2-benzothiazoline-3-one (a 3.5% solution thereof in methanol, manufactured by Daito Chemix Corp.), 0.5 part of calcium hydroxide, and 511 parts of ion exchange water. The respective components were dissolved at 50° C. to yield an aqueous gelatin solution for forming an intermediate layer.

The following were mixed to prepare a coating solution for an intermediate layer: 10.0 parts of the above-mentioned intermediate layer forming aqueous gelatin solution, 0.05 part of sodium (4-nonylphenoxytrioxyethylene) butylsulfonate (a 2.0% by mass solution thereof in water, manufactured by Sankyo Chemical Co., Ltd.), 1.5 part of boric acid (a 4.0% by mass solution thereof in water), 0.19 part of an aqueous polystyrenesulfonic acid (partially neutralized with potassium hydroxide) solution (5% by mass), 3.5 parts of a 4% by mass solution of the following compound (J) (manufactured by Wako Pure Chemicals Industries) in water, 1.2 part of a 4% by mass solution of the following compound (J') (manufactured by Wako Pure Chemicals Industries) in water, and 0.67 part of ion exchange water.

Compound (J)

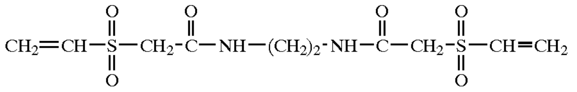

Compound (J')

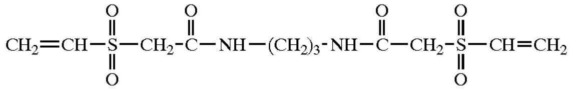

(4) Preparation of a Coating Solution for a Light Transmissivity Adjusting Layer <Preparation of an Ultraviolet Absorber Precursor Microcapsule Solution>

Into 71 parts of ethyl acetate were homogeneously dissolved 14.5 parts of [2-allyl-6-(2H-benzotriazole-2-yl)-4-t-octylphenyl]benzenesulfonate as an ultraviolet absorber precursor, 4.0 parts of 2,2'-t-octylhydroquinone, 1.9 part of tricresyl phosphate, 5.7 parts of $\alpha$-methylstyrene dimer (trade name: MSD-100, manufactured by Mitsui Chemicals, Inc.), calcium dodecylbenzenesulfonate (trade name: Pionin A-41-C, a 70% solution thereof in methanol, manufactured by Takemoto Oil & Fat Co., Ltd.). To the mixed solution were added 54.7 parts of xylylenediisocyanate/trimethylolpropane adduct (trade name: Takenate D110N (a 75% by mass solution thereof in ethyl acetate, manufactured by Mitsui Takeda Chemicals, Inc.) as a capsule wall material, and the mixture was homogeneously stirred to yield an ultraviolet absorber precursor mixed solution (VII).

Separately, 8.9 parts of a 30% by mass solution of phosphoric acid in water and 532.6 parts of ion exchange water were mixed with 52 parts of itaconic acid modified polyvinyl alcohol (trade name: KL-318, manufactured by Kuraray Co., Ltd.), so as to prepare an aqueous PVA solution for ultraviolet absorber precursor microcapsule solution.

To 516.06 parts of this aqueous PVA solution for ultraviolet absorber precursor microcapsule solution was added the ultraviolet absorber precursor mixed solution (VII), and a homogenizer (manufactured by Nippon Seiki Seisakusyo Co., Ltd.) was used to emulsify and disperse the solution at 20° C. To the resultant emulsion were added 254.1 parts of ion exchange water, and the mixture was homogenized. Thereafter, the resultant was stirred at 40° C. to conduct encapsulating reaction for 3 hours. Thereafter, thereto were added 94.3 parts of an ion exchange resin (Amberlite MB-3, manufactured by Organo Corp.) and further the mixture was stirred for 1 hour. Thereafter, the ion exchange resin was filtrated to be removed. The solid concentration in the capsule solution was adjusted so as to be 13.5%. The particle size of the resultant microcapsules was measured with a particle size meter (LA-700, manufactured by Horiba Ltd.). As a result, the median size thereof was 0.23±0.05 $\mu$m. Into 859.1 parts of this capsule solution were incorporated 2.416 parts of a carboxy-modified styrene butadiene latex (trade name: SN-307 (a 48% by mass solution thereof in water), manufactured by Sumitomo Naugatuck Co., Ltd.), and 39.5 parts of ion exchange water, to yield an ultraviolet absorber precursor microcapsule solution.

<Preparation of a Coating Solution for a Light Transmissivity Adjusting Layer>

The following were mixed to yield a coating solution for a light transmissivity adjusting layer: 1000 parts of the above-mentioned ultraviolet absorber precursor microcapsule solution, 5.2 parts of a fluorine-containing surfactant (trade name: MEGAFACE F-120, a 5% by mass solution thereof in water, manufactured by Dainippon Ink & Chemicals, Inc.), 7.75 parts of a 4% by mass solution of sodium hydroxide in water, and 73.39 parts of sodium (4-nonylphenoxytrioxyethylene)butylsulfonate (a 2.0% by mass solution thereof in water, manufactured by Sankyo Chemical Co., Ltd.).

(5) Preparation of a Coating Solution for a Protective Layer

<Preparation of a Polyvinyl Alcohol for a Protective Layer>

The following were mixed: 160 parts of a vinyl alcohol-alkyl vinyl ether copolymer (trade name: EP-130, manufactured by Denki Kagaku Kogyo Kabushiki Kaisha), 8.74 parts of a mixed solution of sodium alkylsulfonate and a polyoxyethylene alkyl ether phosphoric acid ester (trade name: Neoscore CM-57 (a 54 mass % solution thereof in water), manufactured by Toho Chemical Industry Co., Ltd.), and 3832 parts of ion exchange water. The respective components were dissolved at 90° C. for 1 hour to yield a homogeneous polyvinyl alcohol solution for a protective layer.

<Preparation of a Pigment Dispersed Solution for the Protective Layer>

0.2 part of an anionic special polycarboxylic acid type polymer surfactant (trade name: Poise 532A (a 40% by mass solution thereof in water, manufactured by Kao Corp.) and 11.8 parts of ion exchange water were mixed with 8 parts of barium sulfate (trade name: BF-21F, having a barium sulfate content of 93% or more and manufactured by Sakai Chemical Industry Co., Ltd.), and then the respective components were dispersed in a Dyno mill to prepare a pigment dispersed solution for the protective layer. The particle size of this dispersed solution was measured with a particle size meter (LA-910, manufactured by Horiba Ltd.). As a result, the median size thereof was 0.15 μm.

To 45.6 parts of the barium sulfate dispersed solution were added 8.1 parts of colloidal silica (trade name: SNOWTEX O (a 20% by mass dispersed solution thereof in water), manufactured by Nissan Chemical Industries, Ltd.) to yield the target dispersed product.

<Preparation of a Mat Agent Dispersed Solution for the Protective Layer>

3.81 parts of a product in which 1,2-benzthiazoline-3-one was dispersed in water (trade name: Proxel, B. D, manufactured by I.C.I. Co., Ltd.) and 1976.19 parts of ion exchange water were mixed with 220 parts of wheat starch (trade name: Wheat starch S, manufactured by Shinshin Shokuryo Kogyo), and the respective components were homogeneously dispersed to yield a mat agent dispersed solution for the protective layer.

<Preparation of a Coating Blend Solution for the Protective Layer>

The following were homogeneously mixed with 10000 parts of the polyvinyl alcohol solution for the protective layer to yield a coating blend solution for the protective layer: 40 parts of a fluorine-containing surfactant (trade name: MEGAFACE F-120, a 5% by mass solution thereof in water, manufactured by Dainippon Ink & Chemicals, Inc.), 50 parts of sodium (4-nonylphenoxytrioxyethylene) butylsulfonate (a 2.0% by mass solution thereof in water, manufactured by Sankyo Chemical Co., Ltd.), 49.87 parts of the pigment dispersed solution for the protective layer, 16.65 parts of the mat agent dispersed solution for the protective layer, 48.7 parts of a zinc stearate dispersed solution (trade name: Hydrine F115, a 20.5% by mass solution thereof in water, manufactured by Chukyo Yushi Co., Ltd.), and 280 parts of ion exchange water.

(6) Undercoat Layer Attached Substrate

<Preparation of an Undercoat Layer Solution>

To 60 parts of ion exchange water were added 40 parts of enzyme-decomposed gelatin (average molecular weight: 10000, PAGI method viscosity: 15 mP, PAGI method jelly strength: 20 g), and the gelatin was dissolved in the water at 40° C. under stirring to prepare an aqueous gelatin solution for an undercoat layer.

Separately, 8 parts of water-swelling synthetic mica (aspect ratio: 1000, trade name: Somashif ME100, manufactured by Coop Chemical Co.) were mixed with 92 parts of water, and the mica was wet-dispersed in the water in a Visco mill to yield a mica dispersed solution having a median particle size of 2.0 μm. Water was added to this mica dispersed solution so that the concentration of the mica would be 5% by mass. The respective components were homogeneously mixed to prepare a desired mica dispersed solution.

To 100 parts of the 40% by mass gelatin solution in water having a temperature of 40° C. were added 120 parts of water and 556 parts of methanol, and the respective components were sufficiently stirred and mixed. Thereafter, thereto were added 208 parts of the 5% by mass mica dispersed solution, and the respective components were sufficiently stirred and mixed. Thereto were further added 9.8 parts of a 1.66% by mass polyethylene oxide surfactant. The temperature of the solution was kept at 35 to 40° C. Thereto were then added 7.3 parts of a gelatin film hardening agent of an epoxy compound (Denacol EX 80, manufactured by Nagase Chemicals, Ltd.) to prepare a coating solution (5.7% by mass) for the undercoat layer.

<Formation of an Undercoat Layer Attached Substrate>

Wood pulp made of 50 parts of LBPS and 50 parts of LBPK was beaten by means of a Double Disk Refiner to have a Canadian freeness of 300 cc. Thereto were added 0.5 part of epoxidized behenic amide, 1.0 part of anionic polyacrylamide, 1.0 part of aluminum sulfate, 0.1 part of polyamidepolyamine epichlorohydrin, and 0.5 part of cationic polyacrylamide. (The amount of each of these components was the absolute dry weight ratio to the pulp weight.) A base sheet having a weight of 114 $g/m^2$ was then made by means of a Fourdrinier, and the thickness thereof was adjusted to 100 μm by calendar treatment.

Next, both faces of the base sheet were subjected to corona treatment, and then a melting extruder was used to coat one surface of the base sheet with polyethylene so as to have a resin thickness of 36 μm. In this way, a resin layer having a mat face, which will be referred to as the rear face hereinafter, was formed. Next, a melting extruder was used to coat the surface opposite to the surface on which the resin layer was formed with polyethylene containing 10% by mass of anatase type titanium dioxide and a very small amount of ultramarine so as to have a resin thickness of 50 μm. In this way, a resin layer having a glossy face, which will be referred to the front face hereinafter, was formed. The polyethylene coated face as the rear face was subjected to corona treatment. Subsequently, aluminum oxide (trade name: Alumina Sol 100, manufactured by Nissan Chemical Industries, Ltd.) and silicon dioxide (trade name: SNOWTEX O, manufactured by Nissan Chemical Industries, Ltd.) (weight ratio=1/2) dispersed in water were applied, as an antistatic agent, to the rear face in such a manner that the weight thereof after being dried would be 0.2 $g/m^2$. Next, the ethylene resin coated face as the front face was subjected to corona treatment, and subsequently the above-mentioned undercoat solution was applied to the front face in such a manner that the coating amount of mica would be 0.26 $g/m^2$. In this way, an undercoat layer attached substrate was yielded.

<Application of Coating Solutions for Each Layer of Heat-sensitive Recording Material>

The coating solution for the intermediate layer, the coating solution (a) for the heat-sensitive recording layer, the coating solution for the light transmissivity adjusting layer, and the coating solution for the protective layer were applied, in this order, onto the undercoat layer attached substrate at the same time. The application was continuously carried out. The applied solutions were dried at a temperature of 30° C. and a humidity of 30% and at a temperature of 40° C. and a humidity of 30% to yield a heat-sensitive recording material of Example 1.

At this time, the coating solution (a) for the heat-sensitive recording layer was applied in such a manner that the coating amount of the diazonium salt compound (exemplified compound D-3) in the solution would be 0.078 $g/m^2$ in terms of the solid coating amount thereof.

The coating solution for the intermediate layer, the coating solution for the light transmissivity adjusting layer, and the coating solution for the protective layer were applied in such manner that the solid coating amounts thereof would be 2.39 $g/m^2$, 2.35 $g/m^2$, and 1.39 $g/m^2$, respectively.

Example 2

A heat-sensitive recording material of Example 2 was yielded in the same manner as in Example 1 except in that a diazonium salt (exemplified compound D-4) was used instead of the diazonium salt (exemplified compound D-3) used in Example 1.

Comparative Example 1

A heat-sensitive recording material of Comparative Example 1 was yielded in the same manner as in Example 1 except in that 4.2 parts of the following diazonium salt (Z-1) were used instead of 4.9 parts of the diazonium salt (exemplified compound D-3) used in Example 1.

(Z-1)

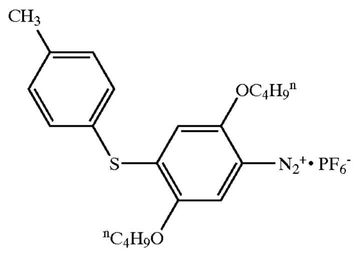

Comparative Example 2

A heat-sensitive recording material of Comparative Example 2 was yielded in the same manner as in Example 1 except in that 4.1 parts of the following diazonium salt compound (Z-2) were used instead of 4.9 parts of the diazonium salt (exemplified compound D-3) and 9.2 parts of ethyl acetate and 8.0 parts of acetonitrile were used instead of 17.2 parts of ethyl acetate in the preparation of the diazonium salt encapsulated microcapsule solution (a) in Example 1.

(Z-2)

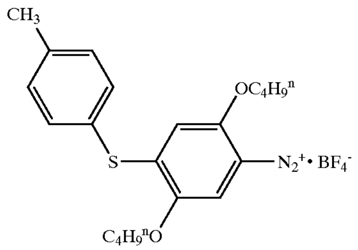

The heat-sensitive recording materials yielded in the above-mentioned examples were evaluated by the following methods. The results are shown in Table 1.

<Thermal Recording Method>

About a thermal head (KST type) manufactured by Kyocera Corp, the electric power applied to the thermal head and the pulse width were decided in such a manner that the recording energy per unit area would be 23 $mJ/mm^2$. This thermal head was used to record each of the heat-sensitive recording materials thermally. In this way, a yellow image was obtained. Thereafter, the resultant image was exposed to light from an ultraviolet lamp having an emission center wavelength of 420 nm and an output power of 40 W for 10 seconds.

<Evaluation of Color-Development Sensitivity>

An X-rite 310TR, manufactured by Nippon Lithography Inc., was used to measure the color-development densities (O.D.(Y)) of the image recorded portion (maximum density portion) and no-recorded portion (background portion) in each of the heat-sensitive recording materials.

<Evaluation of Storability>

Each of the heat-sensitive recording materials on which no image was recorded was forcibly stored under conditions of 60° C. and 30% RH for 72 hours. Thereafter, in the same manner as in the above-mentioned color-developing test, thermal recording was performed to obtain an image. The color-development density thereof was then measured. The reproduction ratio of the maximum density of the image portion after the forcible storage to the maximum density of the image portion before the forcible storage was evaluated. However, in the heat-sensitive recording material of Comparative Example 2, a color was developed at the stage when the heat-sensitive recording layer coating-solution was prepared (that is, fog was generated). Thus, the storability thereof was not evaluated.

<Evaluation of the Fixing Property>

Each of the heat-sensitive recording materials on which no image was recorded was irradiated with light from an ultraviolet lamp having an emission center wavelength of 420 nm and an output power of 40 W for 8 seconds. Thereafter, in the same manner as in the above-mentioned <Thermal recording method>, thermal recording was performed to obtain an image. The color-development density (in the minimum density portion after fixing) was measured. However, in the heat-sensitive recording material of Comparative Example 2, a color was developed at the stage when the heat-sensitive recording layer coating-solution was prepared (that is, fog was generated). Thus, the fixing property thereof was not evaluated.

TABLE 1

| | | Color-development sensitivity | | Storability Reproduction | Fixing property |
|---|---|---|---|---|---|
| | Diazonium salt | Maximum density portion O. D. (Y) | Background portion O. D. (Y) | ratio in the maximum density portion | Minimum density portion after fixing |
| Example 1 | D-3 | 1.44 | 0.06 | 92 | 0.08 |
| Example 2 | D-4 | 1.40 | 0.05 | 90 | 0.08 |
| Comparative Example 1 | Z-1 | 1.44 | 0.06 | 80 | 0.11 |
| Comparative Example 2 | Z-2 | 1.45 | 1.06 | (Fog) | (Fog) |

The results shown in Table 1 demonstrate that in Examples 1 and 2 of the invention, the color-development density of the image recorded portion was sufficiently high and the color-development density of the background portion was lower than that in Comparative Examples 1 and 2. Moreover, the storability of Examples 1 and 2 was superior and the fixing property thereof was also better than that in Comparative Examples 1 and 2. In this way, Examples 1 and 2 show satisfied the evaluated properties sufficiently.

According to the invention, it is possible to provide a heat-sensitive recording material having superior storage stability, as well as satisfactory fixing property when fixed using a fixing light source having a wavelength longer than 400 nm.

What is claimed is:

1. A heat-sensitive recording material comprising a substrate and a heat-sensitive recording layer containing a diazonium salt and a coupler, the heat-sensitive recording layer being disposed on or over the substrate, wherein the diazonium salt is a compound represented by the following general formula (1):

General formula (1)

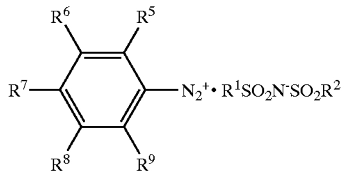

wherein $R^1$ and $R^2$ each independently represent an alkyl group or an aryl group; $R^5$, $R^6$, $R^7$, $R^8$ and $R^9$ each independently represent one selected from the group consisting of a hydrogen atom, a chlorine atom, a bromine atom, an alkyl group, an aryl group, an alkoxy group, an aryloxy group, an acyl group, an alkoxycarbonyl group, an aryloxycarbonyl group, a carbamoyl group, a cyano group, an alkylthio group, an arylthio group, an alkylsulfonyl group, an arylsulfonyl group, an amino group, an amido group, and a nitro group; and two or more of $R^1$, $R^2$, $R^5$, $R^6$, $R^7$, $R^8$ and $R^9$ may be bonded to each other to form a ring.

2. The heat-sensitive recording material of claim 1, wherein the coupler is a compound represented by the following general formula (5):

$$E^1—CH_2—E^2 \quad \text{General formula (5)}$$

wherein $E^1$ and $E^2$ each independently represent an electron attractive group, and $E^1$ and $E^2$ may be bonded to each other to form a ring.

3. The heat-sensitive recording material of claim 1, wherein the diazonium salt is encapsulated in microcapsules.

4. The heat-sensitive recording material of claim 3, wherein capsule walls of the microcapsules contain at least one of polyurethane and polyurea.

5. The heat-sensitive recording material of claim 1, wherein the diazonium salt is contained in an amount of 0.02 to 5 $g/m^2$ in the heat-sensitive recording layer.

6. The heat-sensitive recording material of claim 1, wherein the diazonium salt is contained in an amount of 0.1 to 4 $g/m^2$ in the heat-sensitive recording layer.

7. The heat-sensitive recording material of claim 1, wherein the diazonium salt is a compound represented by the following general formula (2):

General formula (2)

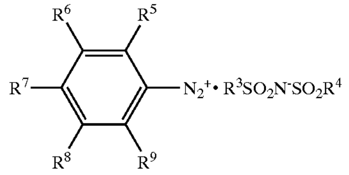

wherein $R^3$ and $R^4$ each independently represent a fluoroalkyl group or a fluoroaryl group; $R^5$, $R^6$, $R^7$, $R^8$ and $R^9$ each independently represent one selected from the group consisting of a hydrogen atom, a chlorine atom, a bromine atom, an alkyl group, an aryl group, an alkoxy group, an aryloxy group, an acyl group, an alkoxycarbonyl group, an aryloxycarbonyl group, a carbamoyl group, a cyano group, an alkylthio group, an arylthio group, an alkylsulfonyl group, an arylsulfonyl group, an amino group, an amido group, and a nitro group; and two or more of $R^3$, $R^4$, $R^5$, $R^6$, $R^7$, $R^8$ and $R^9$ may be bonded to each other to form a ring.

8. The heat-sensitive recording material of claim 7, wherein the coupler is a compound represented by the following general formula (5):

$$E^1—CH_2—E^2 \quad \text{General formula (5)}$$

wherein $E^1$ and $E^2$ each independently represent an electron attractive group, and $E^1$ and $E^2$ may be bonded to each other to form a ring.

9. The heat-sensitive recording material of claim 7, wherein the diazonium salt is encapsulated in microcapsules.

10. The heat-sensitive recording material of claim 9, wherein capsule walls of the microcapsules contain at least one of polyurethane and polyurea.

11. The heat-sensitive recording material of claim 1, wherein the diazonium salt is a compound represented by the following general formula (3):

General formula (3)

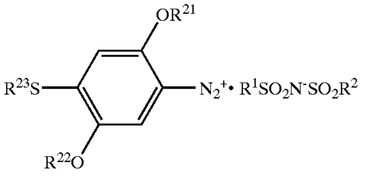

wherein $R^1$ and $R^2$ each independently represent an alkyl group or an aryl group; $R^{21}$, $R^{22}$ and $R^{23}$ each independently represent an alkyl group or an aryl group; and $R^1$ and $R^2$ may be bonded to each other to form a ring.

12. The heat-sensitive recording material of claim 11, wherein the coupler is a compound represented by the following general formula (5):

$$E^1—CH_2—E^2 \quad \text{General formula (5)}$$

wherein $E^1$ and $E^2$ each independently represent an electron attractive group, and $E^1$ and $E^2$ may be bonded to each other to form a ring.

13. The heat-sensitive recording material of claim 11, wherein the diazonium salt is encapsulated in microcapsules.

14. The heat-sensitive recording material of claim 13, wherein capsule walls of the microcapsules contain at least one of polyurethane and polyurea.

15. The heat-sensitive recording material of claim 1, wherein the diazonium salt is a compound represented by the following general formula (4):

General formula (4)

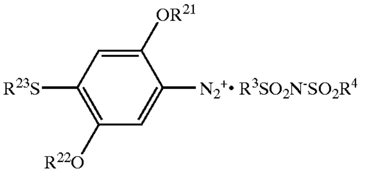

wherein $R^3$ and $R^4$ each independently represent a fluoroalkyl group or a fluoroaryl group; $R^{21}$, $R^{22}$ and $R^{23}$ each independently represent an alkyl group or an aryl group; and $R^3$ and $R^4$ may be bonded to each other to form a ring.

16. The heat-sensitive recording material of claim 15, wherein the coupler is a compound represented by the following general formula (5):

$$E^1—CH_2—E^2 \quad \text{General formula (5)}$$

wherein $E^1$ and $E^2$ each independently represent an electron attractive group, and $E^1$ and $E^2$ may be bonded to each other to form a ring.

17. The heat-sensitive recording material of claim 15, wherein the diazonium salt is encapsulated in microcapsules.

18. The heat-sensitive recording material of claim 17, wherein capsule walls of the microcapsules contain at least one of polyurethane and polyurea.

* * * * *